(12) United States Patent
Bless et al.

(10) Patent No.: US 11,446,919 B2
(45) Date of Patent: Sep. 20, 2022

(54) DEVICE FOR ALPHANUMERIC LABELING OF SECURITIES

(71) Applicant: KOENIG & BAUER AG, Würzburg (DE)

(72) Inventors: Stefan Bless, Detmold (DE); Carsten Diederichs, Lemgo (DE); Antoine Merminod, Gimel (CH)

(73) Assignee: KOENIG & BAUER AG, Würzburg (DE)

( * ) Notice: Subject to any disclaimer, the term of this patent is extended or adjusted under 35 U.S.C. 154(b) by 0 days.

(21) Appl. No.: 17/429,955

(22) PCT Filed: Jul. 7, 2020

(86) PCT No.: PCT/EP2020/069090
§ 371 (c)(1),
(2) Date: Aug. 11, 2021

(87) PCT Pub. No.: WO2021/028122
PCT Pub. Date: Feb. 18, 2021

(65) Prior Publication Data
US 2022/0040968 A1 Feb. 10, 2022

(30) Foreign Application Priority Data

Aug. 13, 2019 (DE) .................... 10 2019 121 778.4
Aug. 13, 2019 (DE) .................... 10 2019 121 779.2
Aug. 13, 2019 (DE) .................... 10 2019 121 780.6

(51) Int. Cl.
*B41K 3/08* (2006.01)
*B41F 13/00* (2006.01)
(Continued)

(52) U.S. Cl.
CPC ...... *B41F 13/0032* (2013.01); *B41F 13/0045* (2013.01); *B41F 33/009* (2013.01);
(Continued)

(58) Field of Classification Search
None
See application file for complete search history.

(56) References Cited

U.S. PATENT DOCUMENTS 10,442,183 B2  10/2019  Franz et al.
2003/0069860 A1  4/2003  Berndtsson et al.
(Continued)

FOREIGN PATENT DOCUMENTS

| AU | 2013209308 A1 | 8/2013 |
| CN | 109591442 A | 4/2019 |
| DE | 3841237 A1 | 6/1989 |
| ES | 2357985 T3 | 5/2011 |
| GB | 2243580 A | 11/1991 |
| JP | 3841231 A1 | 6/1989 |

(Continued)

OTHER PUBLICATIONS

International Search Report of PCT/EP2020/069090 dated Jan. 22, 2020.

*Primary Examiner* — Leslie J Evanisko
(74) *Attorney, Agent, or Firm* — Mattingly & Malur, PC

(57) ABSTRACT

A device for the alphanumeric labeling of printed products comprises a shaft mounted in a frame, and around which shaft at least one wheel-shaped or ring-shaped labeling tool is rotatably mounted, which tool carries a number of alphanumeric characters, one behind the other, on its outer circumference. A drive motor, in the form of, for example, a stepper motor, is provided and by which the labeling tool can be rotated around the shaft. The drive motor is linked for signals transmission to one of a data processing and a data storage of a control device, in which an assignment specification between the working positions of the alphanumeric characters or the fields carrying the alphanumeric characters, and step numbers of the stepper motor, is provided. The drive motor is or can be controlled by the control device in terms of a number of steps to be traveled, using this provided assignment specification, to move an alphanumeric character to be printed or the relevant field into a working position.

12 Claims, 14 Drawing Sheets

(51) Int. Cl.
*B41F 13/004* (2006.01)
*B41F 33/00* (2006.01)
*B41J 7/96* (2006.01)
*B41K 3/12* (2006.01)
*G01R 33/00* (2006.01)
*G01R 33/07* (2006.01)

(52) U.S. Cl.
CPC .............. *B41J 7/96* (2013.01); *B41K 3/127* (2013.01); *G01R 33/0094* (2013.01); *G01R 33/07* (2013.01)

(56) References Cited

U.S. PATENT DOCUMENTS

2010/0005983 A1* 1/2010 Diederichs ............ B41F 33/009
 101/93.01
2019/0084291 A1 3/2019 Franz et al.

FOREIGN PATENT DOCUMENTS

| | | | |
|---|---|---|---|
| JP | 2004160788 A | 6/2004 | |
| JP | 2006224519 A | 8/2006 | |
| JP | 2016175278 A | 10/2016 | |
| WO | WO-9203294 A * | 3/1992 | ............ B41K 3/102 |
| WO | 2007148288 A2 | 12/2007 | |
| WO | 2016/000741 A1 | 1/2016 | |
| WO | 2017157619 A1 | 9/2017 | |

\* cited by examiner

Operation:

DEVICE FOR ALPHANUMERIC LABELING OF SECURITIES

CROSS-REFERENCE TO RELATED APPLICATIONS

This application is the US national phase, under 35 USC § 371, of PCT/EP2020/069090, filed Jul. 7, 2020; published as WO 2021/028122 A1 on Feb. 18, 2021 and claiming priority to DE 10 2019 121 780.6 filed Aug. 13, 2019; to DE 10 2019 121 779.2, filed Aug. 13, 2019 and to DE 10 2019 121 778.4, filed Aug. 13, 2019, the disclosures of which are expressly incorporated herein in their entireties by reference.

FIELD OF THE INVENTION

The present invention relates to devices and a method for the alphanumeric labeling of printed products and to a security printing press. The device for the alphanumeric labeling of printed products comprises a shaft mounted in a frame, around which shaft at least one wheel-shaped or ring-shaped labeling tool, which carries a number of alphanumeric characters, arranged one behind the other on its outer circumference, is rotatably mounted. A drive motor, in the form of, for example, a stepper motor, is provided and by which the labeling tool can be rotated around the shaft, to position one of the characters in a working position. A plurality of such wheel-shaped or ring-shaped labeling tools, each carrying a number of alphanumeric characters one behind the other on its circumference, can be rotatably mounted. One drive motor for multiple ones of, or for each of the plurality labeling tools, by which these tools can be rotated mechanically independently of one another around the shaft, can be provided. A sensor device, having at least one sensor, which is fixed relative to the frame during operation, is provided for each of the plurality of labeling tools, with each such sensor cooperating with at least a number of marks, corresponding to the number of alphanumeric characters, which marks are specific to the functioning method of the sensor and are provided on the respective labeling tool, each in a fixed circumferential position relative to one character carried on the outer circumference. A locking device can be arranged within a clear cross-sectional opening in the ring-shaped labeling tool for securing the working position assumed for the selected character, which locking device can be moved by an actuator from an active position, in which it secures the working position, to an inactive position.

In a method for the alphanumeric labeling of printed products, a printed product is labeled with at least one alphanumeric character by direct or indirect printing of a printing material by the use of at least one of the wheel-shaped or ring-shaped labeling tools, rotatably mounted around a shaft and carrying a number of alphanumeric characters one behind the other in the circumferential direction. An alphanumeric character to be printed is positioned in a working position by rotating the labeling tool around the shaft on which the labeling tool is rotatably mounted. The rotation of the labeling tool is effected by the drive motor, in the form of, for example, a stepper motor.

A security printing press has an input-side printing material feed unit, by which the printing material to be printed can be fed to the printing press on the input side, and an output-side product receiving unit, by which the printing material which had been printed on at least one side, can be combined into bundles. On a printing material path between the printing material feed unit and a product receiving unit, at least one numbering printing couple is provided, which numbering printing couple has a numbering cylinder that carries on its circumference, in the form of a matrix, multiple rows of the devices, one behind the other, each row containing multiple ones of such devices arranged side by side.

BACKGROUND OF THE INVENTION

From WO 2007/148288 A2 a device and a method for the alphanumeric labeling of printed products is known, in which individual numbering wheels are driven mechanically independently of one another, each by its own drive motor, in particular a brushless DC motor. Each numbering wheel, which carries a plurality of alphanumeric characters, additionally carries on its outer circumference a magnet for the purpose of calibration, which can be detected by means of a Hall effect sensor, for example. Additionally provided is a locking element, which is pressed from the inside by a spring force into a groove in the inner circumference of the numbering wheel to secure the position that has been selected and is moved out of the groove via reluctance forces by the application of electric current to a coil.

In JP 2004-160788, numbering wheels are driven by biaxial stepper motors, the angular positions of which are detected by magnets which are located on the outer circumference of intermediate gears of the respective drive train and are detected by magnet sensors. A comb-like locking element engages between the teeth of gears connected to the numbering wheels. The locking element is engaged by activating a solenoid and disengaged by spring force when the solenoid is deactivated.

WO 2016/000741 A1 discloses a device and a method for the alphanumeric labeling of printed products, in which individual numbering wheels are driven by stepper motors or brushless DC motors. The numbering wheel carries markings, in particular magnets, on its outer circumference, which are arranged between the characters and which are detectable by sensors, e.g. Hall effect sensors. The motor additionally carries an encoder which can be used to monitor the movement of the motor shaft. For this purpose, an electronic monitoring system is provided, which is in signals communication with both the encoder and a sensor provided on the numbering wheel, and which monitors the positioning of the wheels by comparing counter readings at the encoder when a marking passes it with target counter readings anticipated for the passage, based on a table.

DE 38 41 231 A1 relates to a coding device for typing wheels or printing wheels, in particular in franking machines. In one embodiment, the position of the typing wheel is characterized by the magnitude of the signal from a Hall effect sensor which is arranged in a fixed shaft within the rotating typing wheel. The inner circumference of the typing wheel extends not with a constant radius, but in a spiral shape with a varying distance from the shaft. In a refinement, individual teeth correlating to the type on the circumference and having a tooth depth that varies along a spiral line can be provided. When the typing wheel is in operation and a certain type is set, the value present at the output of the sensor is compared during rotation with the target value for the signal previously obtained through a referencing run. When the desired position is reached, the system moves on to adjust the next typing wheel or returns to the main program.

GB 2 243 580 A discloses a monitoring device for monitoring the position of marking symbols, in which a magnetic field produced by a magnet which is fixed so as to be stationary on a shaft and one or more magnets provided on the circumference of the symbol wheel is detected on the circumference of the symbol wheel at an angular distance of 90° and is used to determine the position.

WO 201 7/1 5761 9 A1 discloses a screen printing unit and an offset printing unit, along with a numbering printing unit which has on its circumference a plurality of numbering devices arranged in rows and columns.

JP 2006-224519 A relates to a numbering unit, the numbering wheels of which are driven mechanically via a gear train by the rotational movement of the cylinder. The numbering wheels are seated on a rotating shaft and are secured in the position required for the desired character by the engagement of a cam. The cam is moved into the holding position via a magnet.

SUMMARY OF THE INVENTION

The object of the present invention is to create devices and a method for the alphanumeric labeling of printed products and a security printing press.

The object is attained according to the invention by the provision of the drive motor being linked for signal transmission to one of a data processing and a data storage device of a control device, in which an assignment specification between the working positions of the alphanumeric characters, or fields that carry the alphanumeric characters, and step numbers of the stepper motor is provided. The drive motor is or can be controlled by the control device, in terms of the number of steps to be traveled, using this provided assignment specification to move an alphanumeric character to be printed, or the relevant field, into a working position. The sensors are fixed relative to the shaft during operation and are arranged within a clear cross-section of openings in the labeling tool for receiving the shaft. Marks are provided in one of the region of the inner circumference of the relative labeling tools which surrounds the opening, or in that the sensor device comprises two sensors arranged one behind the other, as viewed in the circumferential direction of the shaft. The actuator is in the form of an electromechanically operated drive device which, as a result of different actuation, can be actively moved with an output-side driven element into at least two different defined switching states which bring about the active and the inactive position of the locking element. An electromagnetically operable actuator is located radially outside of the circumferentially extending outer surface of the labeling tool. The rotation of the labeling tool, to position the alphanumeric character to be printed, is carried out with the drive motor, configured as, for example, the stepper motor, using a stored assignment specification between the working positions of the alphanumeric characters or fields carrying the alphanumeric characters, and step numbers of the stepper motor.

The advantages achievable with the invention consist, in particular, in that a particularly reliable and/or precise adjustment of the character or characters to be printed is enabled and/or in that the technical complexity, for example in the region of the rotating parts and/or in terms of additional electrical components, is minimized.

A preferred embodiment of the motor as a stepper motor facilitates the control of motor positions. This in combination with an additional sensor device capable of detecting the required labeling tool positions for the characters during rotation enables a precise referencing and/or a verification to be carried out during operation. For the latter, a check is performed, e.g. during the approach to or upon reaching a target step number specified for a character or field, to determine, based on the signals from the sensor device, whether or not a mark is present in the target position and/or the quality of such a mark.

A particularly suitable device for the alphanumeric labeling of printed products comprises, for example, a shaft mounted in a frame, around which at least one wheel-shaped or ring-shaped labeling tool is rotatably mounted, which carries multiple, i.e. a number of alphanumeric characters arranged one behind the other on its outer circumference, and also comprises drive means having a drive motor in the form of a stepper motor by means of which the labeling tool can be rotated around the shaft. The drive motor is preferably linked for signals transmission to data processing and/or data storage means of a control device, in which an assignment specification between the working positions of the alphanumeric characters and step numbers of the stepper motor is provided, wherein the drive motor is or can be controlled by the control device, applying this provided assignment specification, with respect to the number of steps to be traveled, and in a preferred embodiment also with respect to the direction of the steps, to move a character to be printed into a working position. The control device or a control routine comprised by and/or implemented in the control device is preferably initiated to determine for the character or field subsequently to be selected, proceeding from a specific or current step position of the stepper motor or the numbering wheel and a step number known for that position, and based on the assignment specification, the relevant step number for the subsequent character or field, to calculate from the difference the number of steps to be traveled by the stepper motor, and to control the drive motor according to the calculated number of steps.

The term step number is understood here to mean an individualized step number, whereas the term number of steps means a specific number of steps.

The alphanumeric labeling of printed products preferably involves labeling a printed product with at least one alphanumeric character by directly or indirectly printing a printing material by means of at least one ring-shaped labeling tool, which is mounted rotatably around a shaft and which carries multiple, i.e. a number of alphanumeric characters arranged one behind the other in the circumferential direction, and positioning a character that is to be printed in a working position by rotating the labeling tool around a shaft on which the labeling tool is rotatably mounted, the rotation being effected by a drive motor in the form of a stepper motor, wherein the rotation of the labeling tool to position the character to be printed is carried out by the drive motor using a stored assignment specification between the working positions of the alphanumeric characters and step numbers of the stepper motor. Preferably proceeding from a specific step position of the stepper motor or the numbering wheel and a step number known for that position, the step position implied for the character subsequently to be selected or, based on the assignment specification, the relevant step position implied for that character or field is determined, and from the difference, the number of steps to be traveled by the stepper motor is calculated and the drive motor is controlled according to the calculated number of steps.

In a preferred embodiment, independently of the above aspect or also advantageously in addition thereto, unintended rotation is further blocked by a locking element which is held in the locking position not by spring force, or not solely by spring force, but actively by a stable actuator state. A reliable removal from the locking position is ensured by at least one additional active actuator state.

A suitable device for the alphanumeric labeling of securities comprises, for example, a shaft mounted in a frame, around which at least one wheel-shaped or ring-shaped labeling tool which carries multiple, i.e. a number of alphanumeric characters one behind the other on its outer circumference is rotatably mounted, drive means by which the at least one labeling tool can be rotated around the shaft to position one of the characters in a working position, and a locking means for securing the working position assumed for the selected character, which can be moved by an actuator from an active position, in which it secures the working position, to an inactive position. In a preferred embodiment, this actuator is in the form of an electromechanically operated drive means which can be moved selectively, through different actuation, with its output-side driven element into at least two different defined switching states which bring about the active and the inactive position of the locking element. The actuator is preferably configured such that, in the two switching states, it applies or is capable of applying forces acting in opposite directions to the driven element, which acts directly or indirectly on the locking element. This ensures that, both in the active, i.e. the locking position, and in the inactive, i.e. non-locking position, a force applied by the actuator and acting in the respective direction is present.

In a further preferred embodiment, independently of or advantageously in addition to one or more of the above aspects, a sensor device is provided, which comprises two or more sensors for one or for each numbering wheel to be positioned by an individual motor, the signals of which sensors allow the passage of a mark to be detected and also allow the direction of movement to be determined, and/or which sensor device is fixed in relation to the shaft and is therefore especially well protected, for example, against soiling or damage and/or does not impede access to the wheels, for example.

A suitable device for the alphanumeric labeling of securities then comprises, for example, a shaft mounted in a frame, around which a plurality of wheel-shaped or ring-shaped labeling tools which carry multiple, i.e. a number of alphanumeric characters one behind the other on their outer circumference are rotatably mounted, drive means having one drive motor for multiple or for each of the plurality of labeling tools, by which these tools can be rotated mechanically independently of one another around the shaft, and a sensor device having at least one sensor, fixed relative to the frame during operation, for each of the plurality of labeling tools, each sensor cooperating with at least a number of marks corresponding to the number of alphanumeric characters, which marks are specific to the functioning method of the sensor and are provided on the respective labeling tool, each in a fixed circumferential position relative to one character carried on the outer circumference of the tool. In an abovementioned preferred embodiment, at least two sensors, preferably offset in the circumferential direction, are provided for one or for each numbering wheel to be positioned by an individual motor, and/or the sensors are fixed relative to the shaft during operation and are arranged within the clear cross-section of openings in the labeling tools for receiving the shaft, and the marks are provided in the region of the inner circumference of the labeling tools which extends in the opening.

BRIEF DESCRIPTION OF THE DRAWINGS

Exemplary embodiments of the invention are illustrated in the set of drawings and will be described in greater detail in the following.

The drawings show.

DESCRIPTION OF PREFERRED EMBODIMENTS

Figure 1:
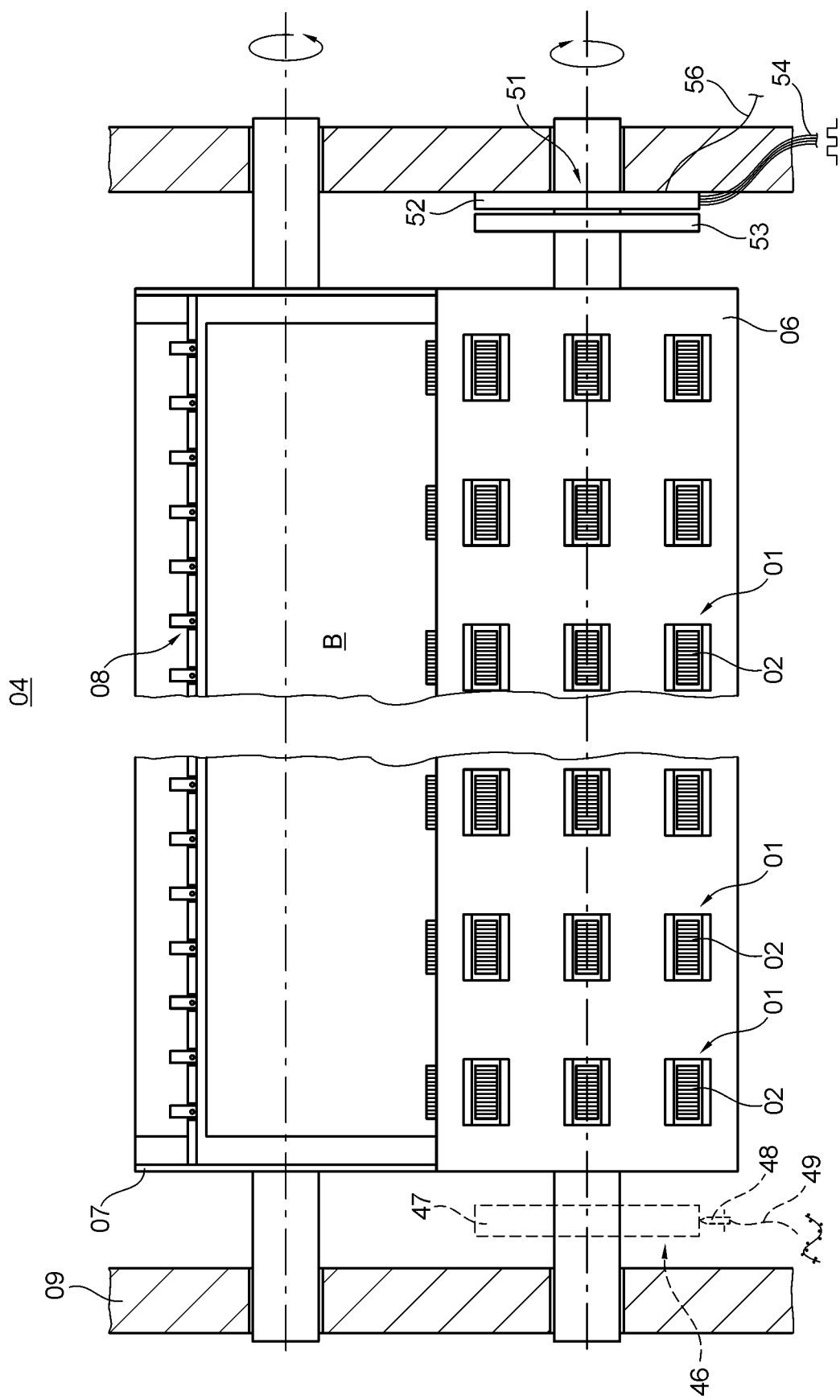
FIG. 1 a schematic exemplary embodiment of a printing couple for alphanumeric labeling of printed products.
Figure 2:
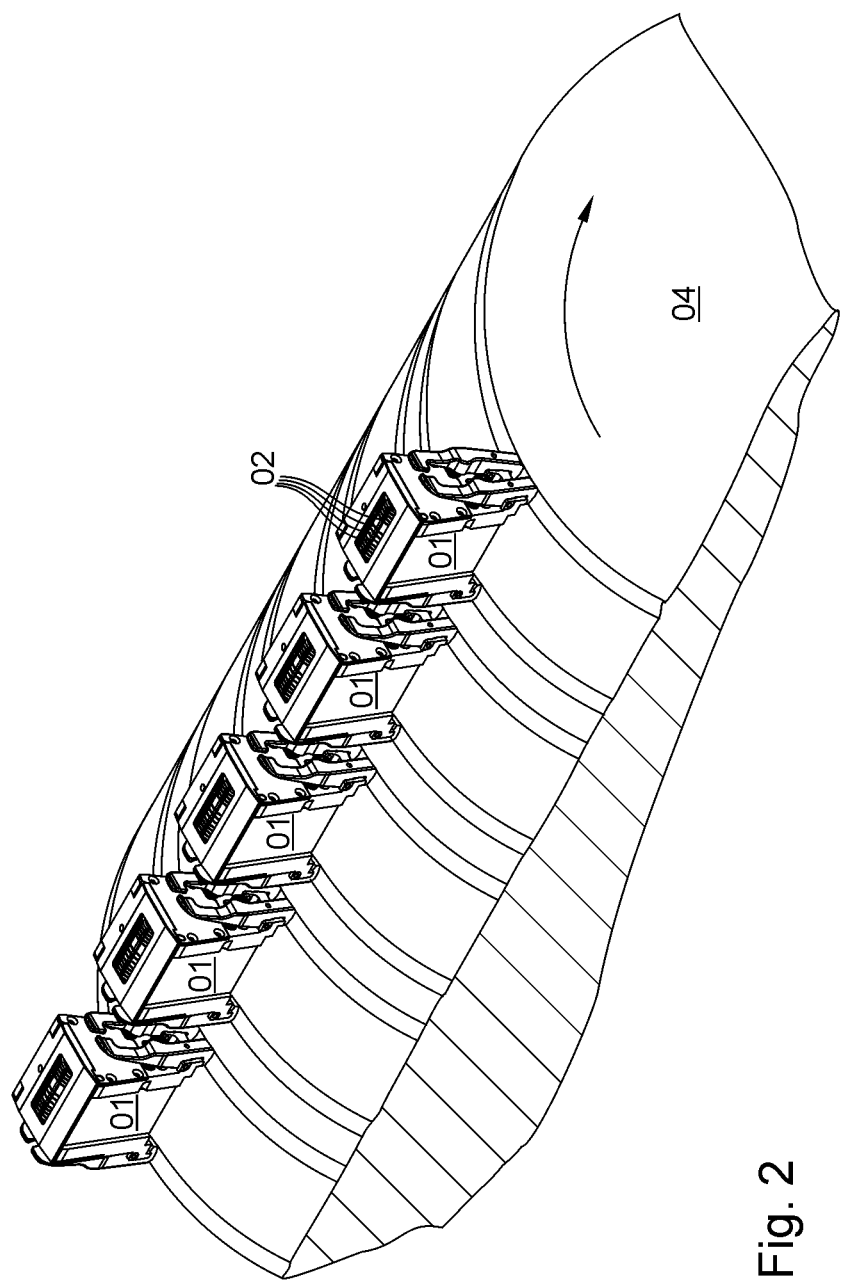
FIG. 2 an exemplary embodiment of the arrangement of a row of labeling devices on the circumference of a printing couple cylinder.
Figure 3:
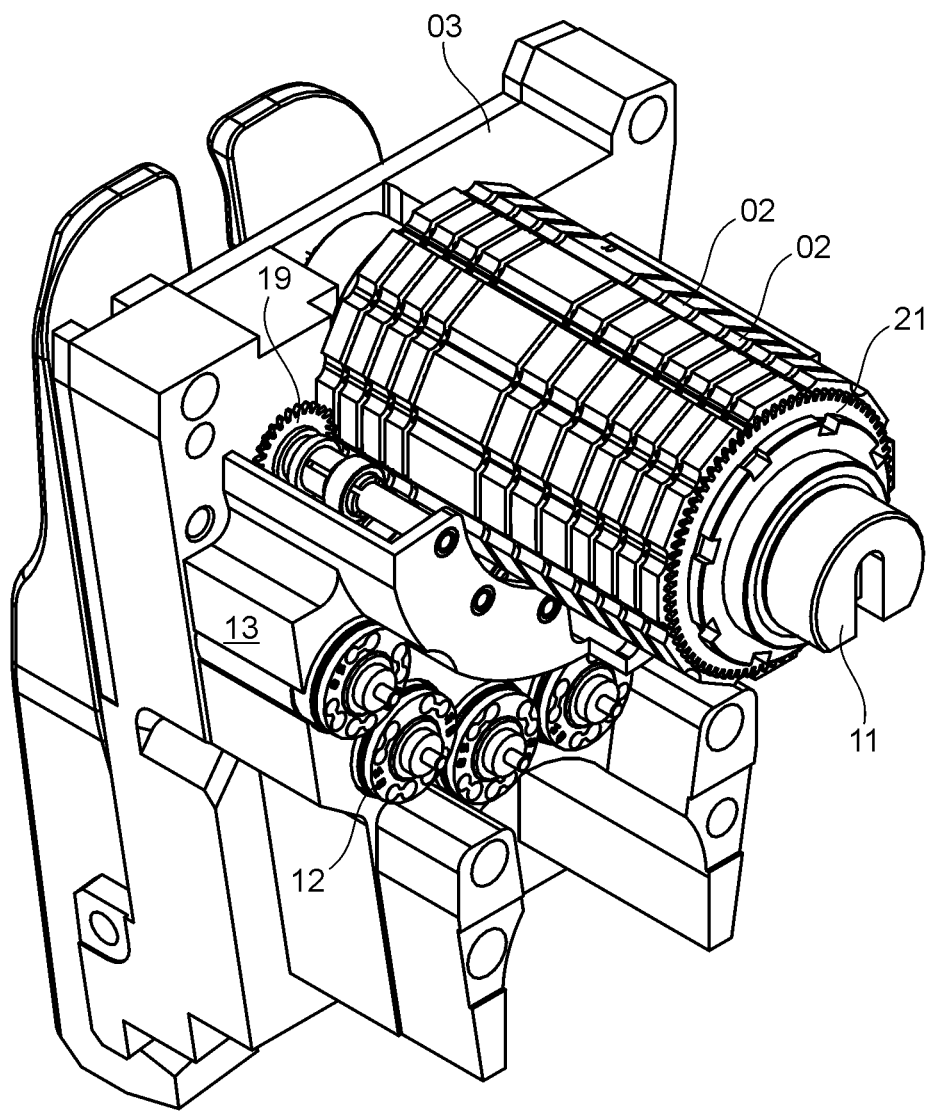
FIG. 3 an illustration, open to one side, of an exemplary embodiment of a labeling device.
Figure 4:
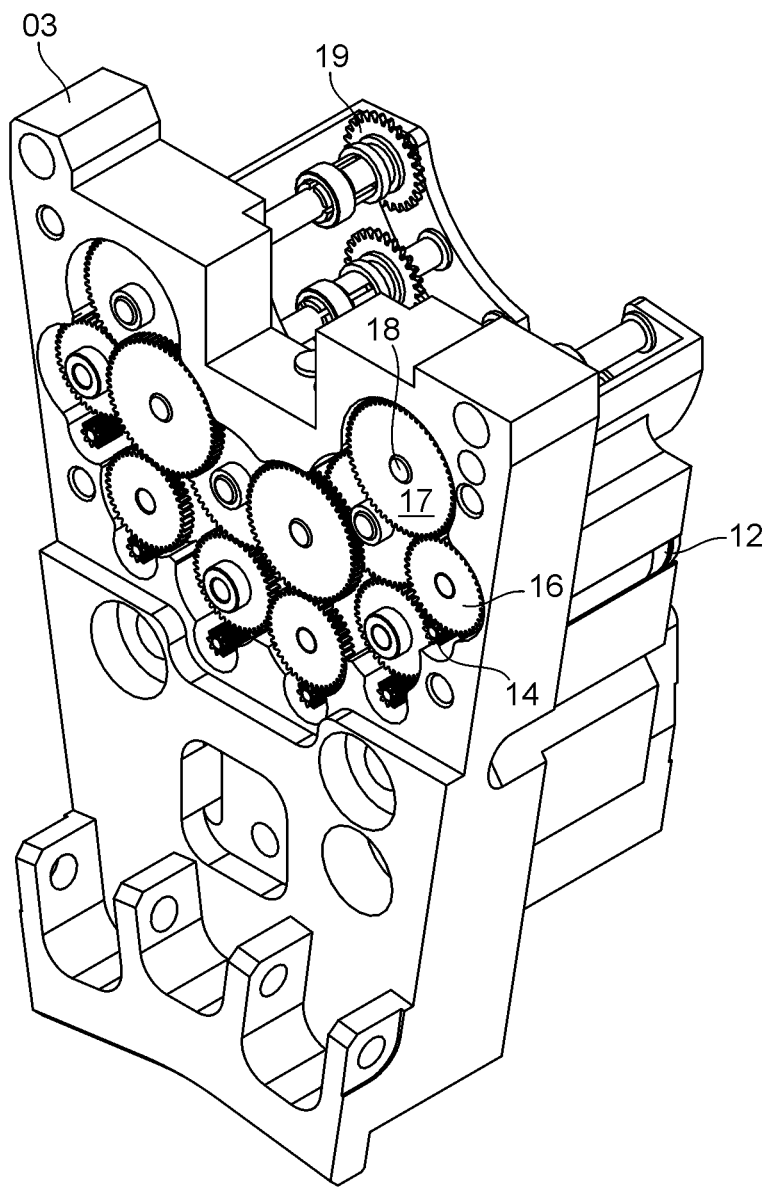
FIG. 4 an illustration of the exemplary embodiment of FIG. 3 from the other side.

A device 01 for the alphanumeric labeling of printed products, in particular securities, comprises at least one, preferably multiple, e.g. a number p ($p \in \mathbb{N}$, $p>1$) of wheel-shaped or ring-shaped labeling tools 02 arranged side by side, which are mounted rotatably around a shaft 11 which is mounted in a frame 03 and/or housing 03. Preferably at least six, or even at least twelve such labeling tools 02 are arranged side by side, for example.

Figure 5:
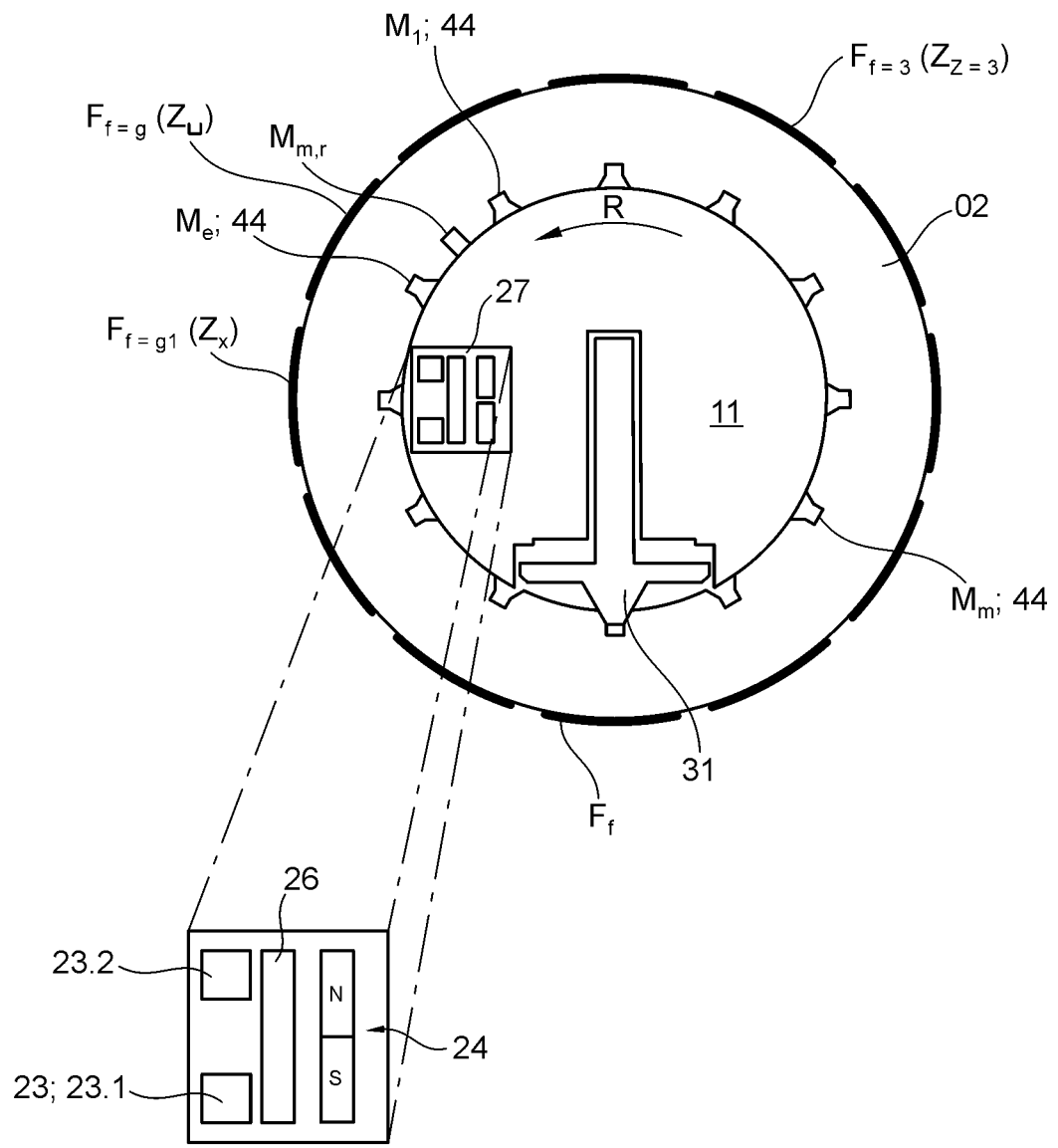
FIG. 5 a schematic illustration of a shaft of a labeling device carrying a labeling wheel.

On its outer circumference, each of the labeling tools 02 carries print templates for multiple, i.e. a number k ($k \in \mathbb{N}$, $k>1$) of alphanumeric characters $Z_z$ ($z$ being from $\{1, 2, \ldots k\}$) arranged one behind the other. Although, strictly speaking, the reference here is to print templates of characters, in the following for the sake of simplicity these will be referred to simply as "characters $Z_Z$". The characters $Z_Z$ are located in angular segments of the labeling tool 02, although it is not necessary for a character $Z_Z$ to be provided in each angular segment. Thus, for example, k fields $F_f$ (with f being from $\{1, 2, \ldots g\}$, $g \in \mathbb{N}$, $g \geq k$), i.e. circumferential sections provided for printing, are provided with k alphanumeric characters $Z_Z$, and one additional field $F_f$ without a character, e.g. a blank field for a space character $Z_\sqcup$ and/or a field $F_f$ with a character $Z_X$ in the form of a special character or symbol may be provided, which is used, for example, to label a misprint, i.e. a copy of unacceptable quality, for example. Twelve fields $F_f$ may be provided on the circumference, for example, with fields $F_f$ being provided for numerals 0 to 9 as alphanumeric characters $Z_Z$, a blank field being provided for a missing character $Z_\sqcup$, e.g. space character $Z_\sqcup$, and/or a character $Z_X$ provided for labeling misprints, e.g. error character $Z_X$ or error symbol, for example (e.g. in FIG. 5, by way of example, the nine fields $F_f$ containing the numerals 0 to 9 as alphanumeric characters $Z_Z$ are denoted here, e.g. by the field $F_{f=3}$, a field $F_f$ for an error character $Z_X$ is denoted here, e.g. by the field $F_{f=g-1}$, for example, and a field $F_f$ without a character, i.e. a space character $Z_\sqcup$, is denoted here, e.g. by the field $F_{f=g}$).

In the following, the labeling tools 02 are also referred to as "numbering wheels" 02, regardless of whether they carry only numerical characters $Z_Z$. In addition to the p labeling tools 02, one or more such wheel-shaped or ring-shaped elements may be provided, which correspond structurally to the labeling tools 02 but do not carry any $Z_Z$ characters on their circumference and which serve only to fill empty spaces in the character sequence or make up for an insufficient size.

Although such devices 01 for the alphanumeric labeling of printed products, known as labeling devices 01 or numbering devices 01 for short, can generally be provided in any labeling machines, here they are preferably used for labeling multiple-up copies of securities in a printing couple 04 of a printing press, preferably a rotary printing press, in particular a security printing press. Such a device comprises, for example, an input-side printing material feed unit by which the printing material B to be printed can be fed, e.g. as web-format or preferably sheet-format printing material B, to the printing press on the input side thereof, an output-side product receiving unit by which the printing material B which has been printed on at least one side can be combined into bundles, e.g. rolls or preferably stacks of sheets, and a printing couple 04, in particular a numbering printing couple 04, arranged therebetween in the printing material path, by which multiple-up copies of securities provided in rows and columns, for example, on the printing material B can be labeled with multiple-digit character strings, i.e. "numbered".

The printing couple 04 comprises, for example, a printing couple cylinder 06, e.g. a numbering cylinder 06, which carries in the region of its circumference, in the form of a matrix, multiple rows arranged one behind the other, with each row containing multiple labeling devices 01 arranged side by side, and also comprises a printing couple cylinder 07 which supports the printing material B during printing. In the case of sheet-format printing material B, this printing couple cylinder 07, e.g. impression cylinder 07, is used simultaneously for sheet transport, for example, and comprises one or more holding devices 08, e.g. gripper bars 08, on its circumference. The printing couple cylinders 06; 07 are mounted rotatably in frame walls of a frame 09, for example.

The labeling devices 01 can be used to apply print images of multi-digit character strings to the printing material B, directly by direct printing or optionally indirectly via at least one additional printing couple cylinder. The labeling devices 01 may be integrated structurally with their frames 03 into the printing couple cylinder 06. Preferably, however, they are arranged detachably on the circumference of a cylinder body and, in a preferred refinement, can be variably positioned on the cylinder body, at least in the circumferential direction.

Preferred embodiments, refinements, and variants of such a labeling device 01 will be set out in the following, generally independently of the above-described use in an above numbering printing couple 04 and/or a security printing press, but preferably in conjunction with such a printing couple or printing press.

In the preferred embodiment, multiple, in particular all of the p numbering wheels 02 can be motor driven mechanically independently of one another via drive means. In principle, suitable drive motors 12 of any desired embodiment may be provided for the mechanically independently driveable numbering wheels 02. In the preferred embodiment here, however, each drive motor 12 for rotating one numbering wheel 02 mechanically independently of other numbering wheels 02 around the shaft 11 is in the form of a stepper motor 12. The stepper motor 12 is configured with two phases, for example, and/or has, e.g. 15 to 25 steps inside the motor, preferably 20 steps per revolution. To ensure high positioning accuracy, the stepper motor 12 has a holding torque (energized) of at least 1.2 mNm, preferably at least 1.5 mNm.

To achieve a high degree of angular precision for the numbering wheel 02 and/or an increase in torsional resistance, for example, the drive train preferably comprises a single-stage or multi-stage gear reducer between the motor rotor and the numbering wheel 02, with a resulting reduction ratio of at least 15 (rotor revolutions):1 (numbering wheel revolution), in particular ranging from 15:1 to 25:1, for example 20:1.

The drive train can be configured in various ways suitable for outputting power from the drive motor 12 to the associated numbering wheel 02 and to achieve the aforementioned gear reduction, for example. In a variant not shown here, the drive train comprises, e.g. an adapter gearset assigned directly to the output of the drive motor 12, e.g. a planetary gearset, with an output-side pinion 14. Between the pinion 14, which is seated on the drive motor 12 or possibly on the adapter gearset, and a gear 21, e.g. driving gear 21, assigned to the numbering wheel 02 and fixed for conjoint rotation therewith around the same axis of rotation, a gearset having one or more gear stages is provided. For example, a first gear stage is provided by the pinion 14 and a gear 16, e.g. intermediate gear 16, that meshes with it, while in a second gear stage, the intermediate gear drives a larger gear 17, e.g. spur gear 17, which is arranged on a common shaft 18 for conjoint rotation with a further gear 19 and in a third gear stage drives the relatively larger driving gear 21.

The drive motors 12 can be arranged resting flat against brackets 13, e.g. supports 13, to allow the heat that is generated during operation to be dissipated via the contact, for example.

Figure 13:
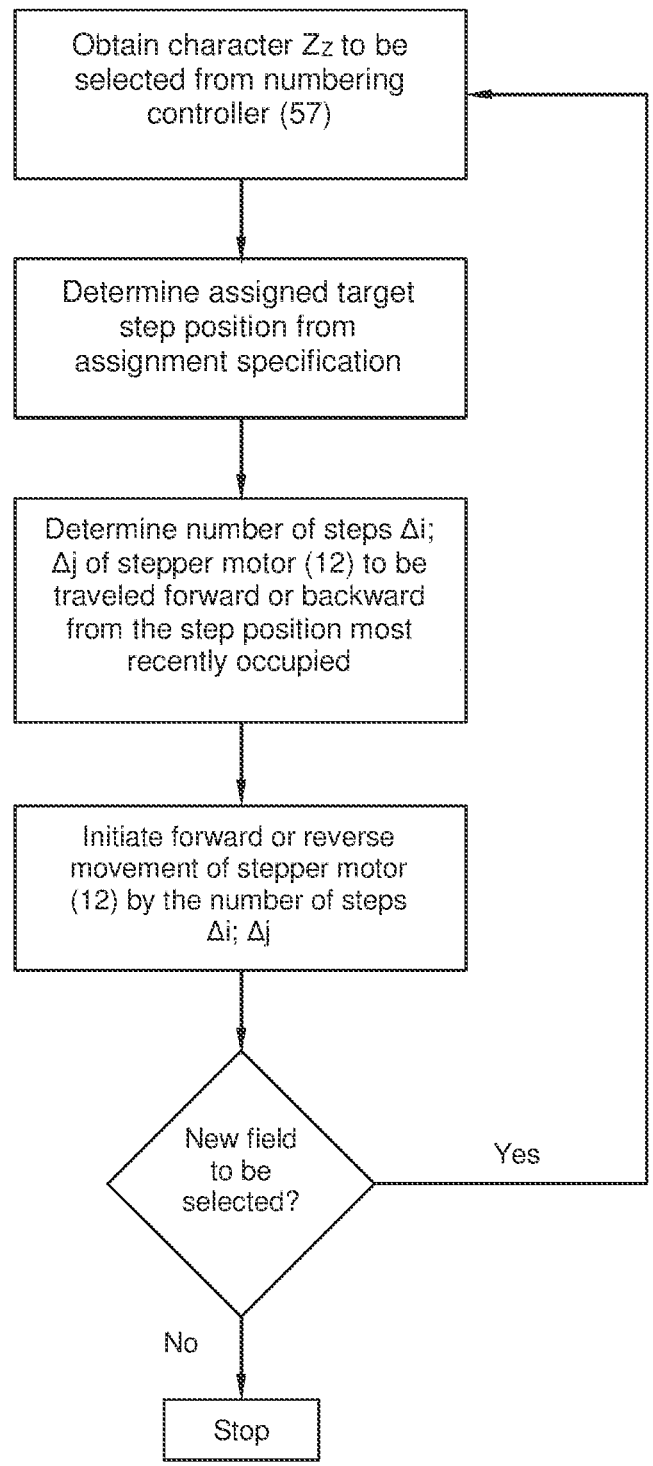
FIG. 13 a flow chart for approaching fields to be selected using the correlation between the fields and the step numbers of the stepper motor during operation.

To control the drive motor 12, in particular the stepper motor 12, the motor or its internal motor controller is linked for signals transmission to data processing and/or data storage means (not shown here) of a control device 22, in which an assignment specification V between the working positions of the alphanumeric characters $Z_Z$ and the step numbers of the stepper motor 12 is provided. The assignment specification V may be provided, in particular stored, in tabular form or in the form of a functional correlation. During operation, to move a character $Z_Z$ to be printed by means of the numbering wheel 02 into a working position in which the character $Z_Z$ in question is in the position specified for printing, the drive motor 12 is or can be controlled by the control device 22 or by a control routine implemented therein, applying the provided assignment specification V, with respect to the number of steps $\Delta i$; $\Delta j$ to be traveled by the stepper motor 12 in particular to move the next alphanumeric character $Z_Z$ to be printed or the relevant field $F_f$ into a working position. Thus, for example, proceeding from a specific, in particular currently occupied step position of the stepper motor 12 or of the numbering wheel 02 and a step number i; j (with i, j being from $\{1, 2, \ldots i_G\}$) known for that position, for the character $Z_Z$ or field $F_f$ subsequently to be selected the relevant step number i'; j' (with i', j' being from $\{1, 2, \ldots i_G\}$) for that character $Z_Z$ or field $F_f$ will be or is determined based on the assignment specification V, and from the difference, the number of steps $\Delta i$; $\Delta j$ to be traveled by the stepper motor 12 is calculated, wherein an analysis of the distance is also taken into account or can be carried out to determine the direction in which the new step number i'; j' can be reached most quickly. The drive motor 12 is then or will then be controlled according to the calculated number of steps $\Delta i$; $\Delta j$, if applicable taking the direction of rotation R into account. If no further change in the character $Z_Z$ to be printed or the field $F_f$ to be selected is pending, the stepper motor 12 is held in position either by applying a holding current or by a locking means 31, which will be explained further below. When it is time for a further change in the character $Z_Z$ to be printed or in the field $F_f$ to be placed in the working position, the procedure for selecting the new rotational position of the numbering wheel is repeated (see, e.g. FIG. 13). The control device or the control routine comprised by the control device 22 and/or implemented therein is accordingly initiated to determine, proceeding from a specific or current step position of the stepper motor 12 or of the numbering wheel 02 and a step number i; j (with i, j being from $\{1, 2, \ldots i_G\}$) known for that position, and based on the assignment specification V, for the character $Z_Z$ or field $F_f$ subsequently to be selected, the relevant step number i'; j' (with i', j' being from $\{1, 2, \ldots i_G\}$) for that character $Z_Z$ or field $F_f$, to calculate from the difference the number of steps $\Delta i$; $\Delta j$ to be traveled by the stepper motor 12, and to control the drive motor 12 according to the calculated number of steps. In an advantageous embodiment, the control device or control routine is further configured to analyze the distance to determine the direction in which the new step number i'; j' can be reached most quickly and to then take this direction of rotation R into account in controlling the drive motor.

In the assignment specification V, the working positions of the alphanumeric characters $Z_Z$ and, if applicable, space characters and/or error characters $Z_\sqcup$; $Z_X$ may themselves be assigned directly to the step numbers i; j, or the fields $F_f$ provided for the characters $Z_Z$; $Z_\sqcup$; $Z_X$ on the numbering wheel 02 may be assigned to the step numbers. In the latter case, for example, an assignment specification V between the alphanumeric character $Z_Z$ specified by a numbering controller 57, for example, and the related field $F_f$ is also provided. The sequence of characters $Z_Z$ or multi-digit character strings for the at least one numbering device 01 is generated and specified, for example by a higher-level numbering controller 57, e.g. using corresponding numbering instructions.

The assignment specification V can generally be established using any desired sensor system in a reference run in which a signal relating to the working positions of the character $Z_Z$ or field $F_f$ to be selected can be identified and linked to an absolute or relative specific step number for that working position. In this process, for example, the total number of motor steps $i_G$ required for one revolution of the numbering wheel 02 are traversed, sensor-specific marks $M_{m,r}$ belonging to the working positions of the characters $Z_Z$ or fields $F_f$ are detected by at least one sensor 23; 23.1; 23.2 of the sensor device, and the corresponding step number i; j resulting from the respective detection of a mark $M_m$, optionally following further analysis and/or scaling or normalization, is logged and stored as belonging to a character $Z_Z$ or field $F_f$. In principle, the marks $M_m$ or the information content thereof that can be read by the sensor system can comprise information that uniquely and positively identifies the respective field $F_f$ or character $Z_Z$. This would then create a direct association between the character $Z_Z$ or field $F_f$ and the relevant step number i; j for the working position. In the embodiment shown here, which is less complex in terms of the characteristics of the system of marks, in addition to the marks $M_m$ that represent the respective working positions of the characters $Z_Z$ or fields $F_f$, a mark $M_{m,r}$ that serves as a reference, or reference mark $M_{m,r}$ for short, is assigned, which identifies, by its relative position, a specific unique position of the numbering wheel 02 and thereby defines the relative position of the individual characters $Z_z$ or fields $F_f$. The procedure of detecting marks $M_m$; $M_{m,r}$ and assigning them a step number $i_m$; $i_r$ is carried out at least until the marks $M_m$ of all the characters $Z_Z$ or fields $F_f$, including the reference mark $M_{m,r}$ if applicable, have been passed, but preferably for at least one full revolution of the numbering wheel 02.

Figure 10:
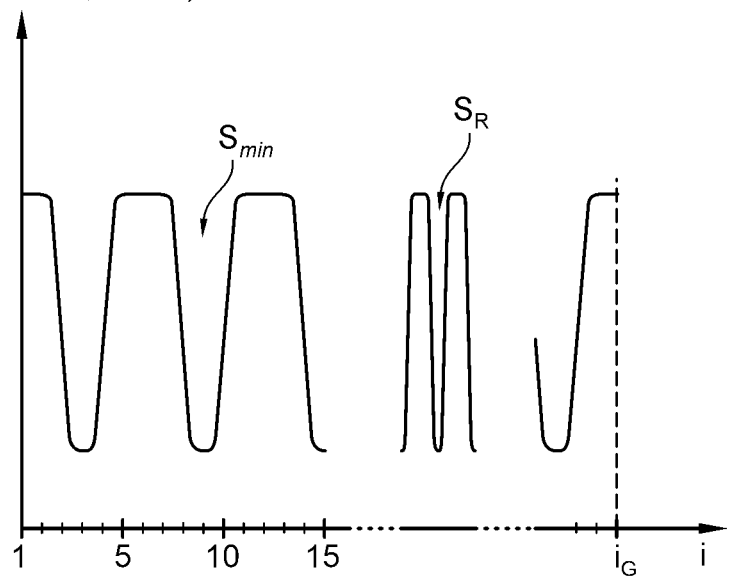
FIG. 10 a graphic representation of the signal curve at a sensor as a function of the step number on the motor with a full 360° revolution of the labeling wheel.
Figure 11:
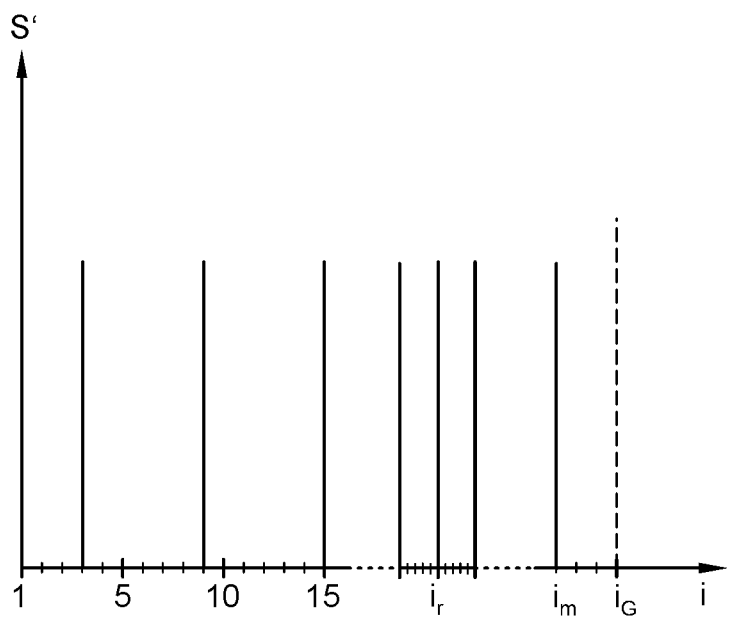
FIG. 11 a graphic representation of the assignment between the positions of the markings and the step numbers following analysis of the signal curve from FIG. 10.
Figure 11:
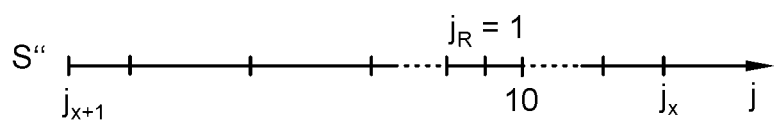
Figure 12:
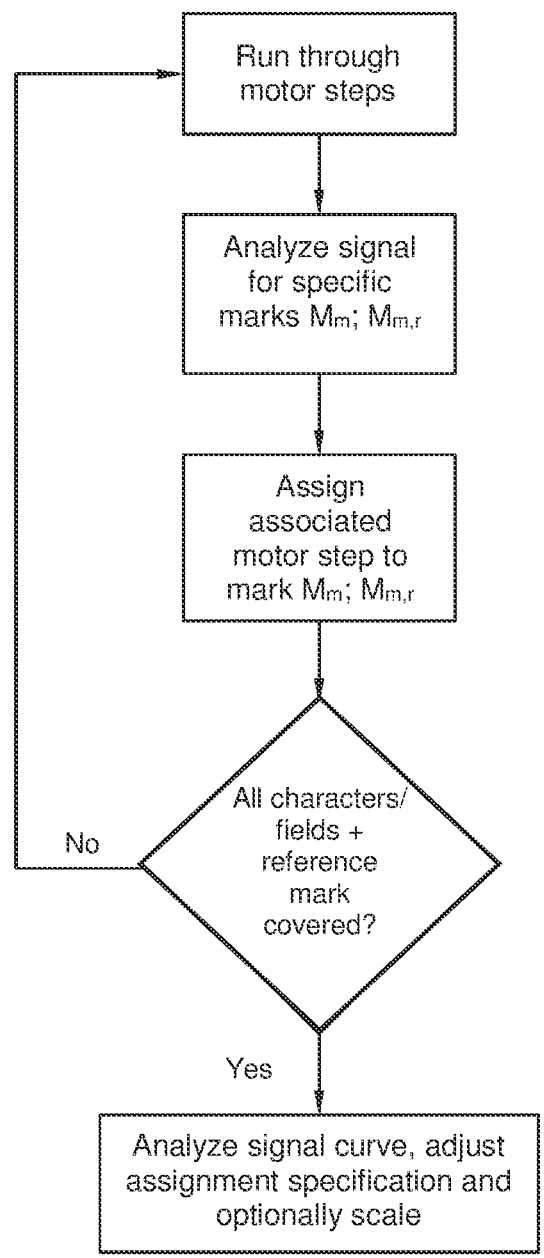
FIG. 12 a flow chart for establishing the correlation between the individual fields or characters and the step numbers of the stepper motor during a referencing run.

In the embodiment preferred here (see, e.g. the purely qualitative representations in FIG. 10 and FIG. 11), the signal curve $S(23)$; $S(23.1)$; $S(23.2)$ produced during one revolution of the numbering wheel 02 is picked up at the output of the at least one sensor 23; 23.1; 23.2. Depending on the features of the marks $M_m$; $M_{m,r}$, characteristics typical of the passage of the marks, for example, e.g. maxima or minima $S_{min}$, are produced in the signal curve $S(23)$; $S(23.1)$; $S(23.2)$ plotted against the step numbers i of the drive motor 12, for example, as soon as the sensor 23; 23.1; 23.2 is passed by a mark $M_m$; $M_{m,r}$ on the rotating numbering wheel 02. In the example illustrated here by way of example, these are generally readily identifiable minima $S_{min}$. The position of the characteristics, e.g. minima $S_{min}$, can be precisely determined computationally, for example, using suitable frequency filters and/or edge analyses, for example. The calculated values for the step numbers i present in the minima $S_{min}$ can then be assigned to the individual fields $F_f$ or characters $Z_Z$; $Z_\sqcup$; $Z_X$, factoring in the position of the reference signal $S_R$, which can be identified based on the signal shape and/or signal sequence (see, for example, a signal assignment S' following analysis of the signal curve $S(23)$; $S(23.1)$; $S(23.2)$ in FIG. 11), and form the basis for a tabular assignment specification V or control points for a computational assignment specification V. Depending upon whether the referencing run was begun at a random numbering wheel position and whether a scale beginning with a step number i=1 at the reference mark $M_{m,r}$ will be used going forward, a shifting of the axis relating to the step number i toward a scaled assignment between the marks $M_m$; $M_{m,r}$ and scaled step numbers j can be carried out or provided (see, for example, a signal assignment S" following additional scaling of the original signal assignment S' in FIG. 11). The step number $i_G$ then becomes, e.g. a step number ix, while the previous step number i=1 becomes the step number $i_{x+1}$. For the aforementioned case involving absolute identifiability of the individual marks $M_m$ by their specific features, the above-described steps associated with the relationship to the reference signal $S_R$ may be omitted. In place of these steps, a direct assignment between the individual fields $F_f$ or characters $Z_Z$; $Z_{\llcorner}$; $Z_X$ and the original or scaled step numbers i; j can be carried out.

Thus, regardless of whether the procedure is based on the uniqueness of the marks $M_m$ or a reference mark $M_{m,r}$ is used, the assignment specification V is created in the form of a table or a functional correlation, for example, based on the working positions and associated step numbers i determined using the marks $M_m$; $M_{m,r}$. If, after the referencing run, the reference mark $M_{m,r}$ is not at step "1", for example, scaling can also be performed in such a way that the reference position is at step number "1".

As a result, therefore, to create the assignment specification V, the numbering wheel 02 is rotated in a direction of rotation R, e.g. operating direction of rotation R, by at least one full revolution, during which marks $M_m$ which are spatially permanently assigned to the characters $Z_Z$; $Z_{\llcorner}$; $Z_X$ or fields $F_f$ on the numbering wheel 02 are detected, preferably along with a reference mark $M_{m,r}$, by the sensor device, these marks are assigned in an assignment specification V to a respective number of steps traveled by the drive motor 12 or to a respective step number i that is reached, and the character $Z_Z$ or field $F_f$ that corresponds to the mark $M_m$; $M_{m,r}$ in question is assigned. During operation, this assignment between the characters $Z_Z$; $Z_{\llcorner}$; $Z_X$ or fields $F_f$ and the assigned step numbers i; j, originally recorded or, if applicable, scaled to the reference position, i.e. the position of the reference mark $M_{m,r}$, is used for controlling the stepper motor 12 in its approach to the working positions for the characters $Z_Z$; $Z_{\llcorner}$; $Z_X$ or fields $F_f$. In addition, e.g. during operation in the presence of a sensor device as mentioned above and/or described in greater detail below, during the approach to or upon reaching a target step number specified for a character $Z_Z$; $Z_{\llcorner}$; $Z_X$ or field $F_f$, a check can be performed to determine, based on the signals from the sensor device, whether or not a mark $M_m$ is present in the target position, and/or the quality of such a mark.

Generally independently of the above-described use for referencing a stepper motor 12 that drives a numbering wheel 02, but advantageously in conjunction with such a use, an advantageous embodiment of a sensor system is described below.

The sensor device comprises, e.g. at least one sensor 23 for each of the plurality of numbering wheels 02, each sensor being fixed relative to the frame during operation. These sensors 23 cooperate with at least the number l ($l \in \mathbb{N}$, l≥k) of marks $M_m$ (with m being from {1, 2, . . . l}) that corresponds to the number k of alphanumeric characters $Z_Z$, which marks are specific to the functioning method of the sensor 23 and are provided on the respective numbering wheel 02, each in a fixed circumferential position relative to a character $Z_Z$; $Z_{\llcorner}$; $Z_X$ or field $F_f$ carried on the outer circumference of the wheel. During operation, the sensors 23; 23.1; 23.2 are preferably fixed relative to the shaft and arranged within the clear cross-section of openings in the numbering wheels 02 for receiving the shaft 11, and the marks $M_m$; $M_{m,r}$ are provided in the region of the inner circumference, which extends in the opening, of the relevant numbering wheels 02. Thus, the sensors 23 provided in or on the shaft 11, for example, cooperate with marks $M_m$ that are detectable by the sensors 23 and are provided in the region of the inner circumference of the numbering wheels 02 surrounding the shaft 11 with their angular position in a fixed correlation with an assigned character $Z_Z$; $Z_{\llcorner}$; $Z_X$ or field $F_f$.

In addition to the marks $M_m$ assigned to the characters $Z_Z$; $Z_{\llcorner}$; $Z_X$ or fields $F_f$, a mark $M_{m,r}$ which serves as a reference for the assumption of a defined angular position, or reference mark $M_{m,r}$ for short, is preferably provided.

In a preferred embodiment, the sensor device comprises sensors 23 in the form of magnetic field sensors 23, in particular Hall effect sensors 23 (preferably linear), and a magnet 24, in particular a bias magnet 24, positioned further inward radially. In an advantageous embodiment, the magnet 24 extends continuously in an axial direction over a longitudinal section that lies opposite the marks $M_m$; $M_{m,r}$ of multiple, preferably all of the numbering wheels 02.

In a particularly advantageous embodiment, the marks $M_m$; $M_{m,r}$ are provided in the form of inhomogeneities in magnetic susceptibility and/or permeability in the inner circumferential region of the numbering wheels 02 surrounding the shaft 11. Preferably, deviations, in particular, from a circular or cylindrical profile in the inner circumferential surface facing the shaft 11 are provided, said surface being made of a magnetic material that preferably does not itself generate a magnetic field. For example, protrusions $M_m$; $M_{m,r}$ or preferably indentations $M_m$; $M_{m,r}$ in the otherwise circular or cylindrical inner circumferential surface are provided as marks $M_m$; $M_{m,r}$. Thus, the effects of the marks $M_m$; $M_{m,r}$ are preferably based not on a magnetic field emanating from the marks, but on a change or disruption in the magnetic field of a magnet 24 which is fixed relative to the frame, in particular fixed relative to the shaft. Therefore, in contrast to solutions from the prior art, the marks $M_m$; $M_{m,r}$ are preferably provided not by magnets, but rather by inhomogeneities that affect a magnetic field.

A number m ($m \in \mathbb{N}$, m>1), for example, of ring-shaped numbering wheels 02, each carrying alphanumeric characters $Z_Z$ and driven in particular by an individual motor, are rotatably mounted on a longitudinal section all of the shaft 11, and on this longitudinal section all, a number n ($n \in \mathbb{N}$, n≥m) of sensors 23 that corresponds precisely to this number or at least this number m of numbering wheels 02 each driven in particular by an individual motor are provided spaced, in particular equidistantly, from one another in the axial direction in or on the shaft 11.

Figure 6:
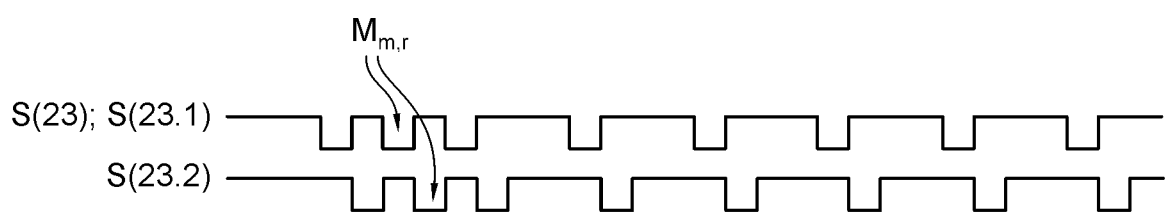
FIG. 6 a schematic diagram illustrating the signal sequences from two sensors according to an embodiment of the sensor device as shown in FIG. 5.
Figure 7A:
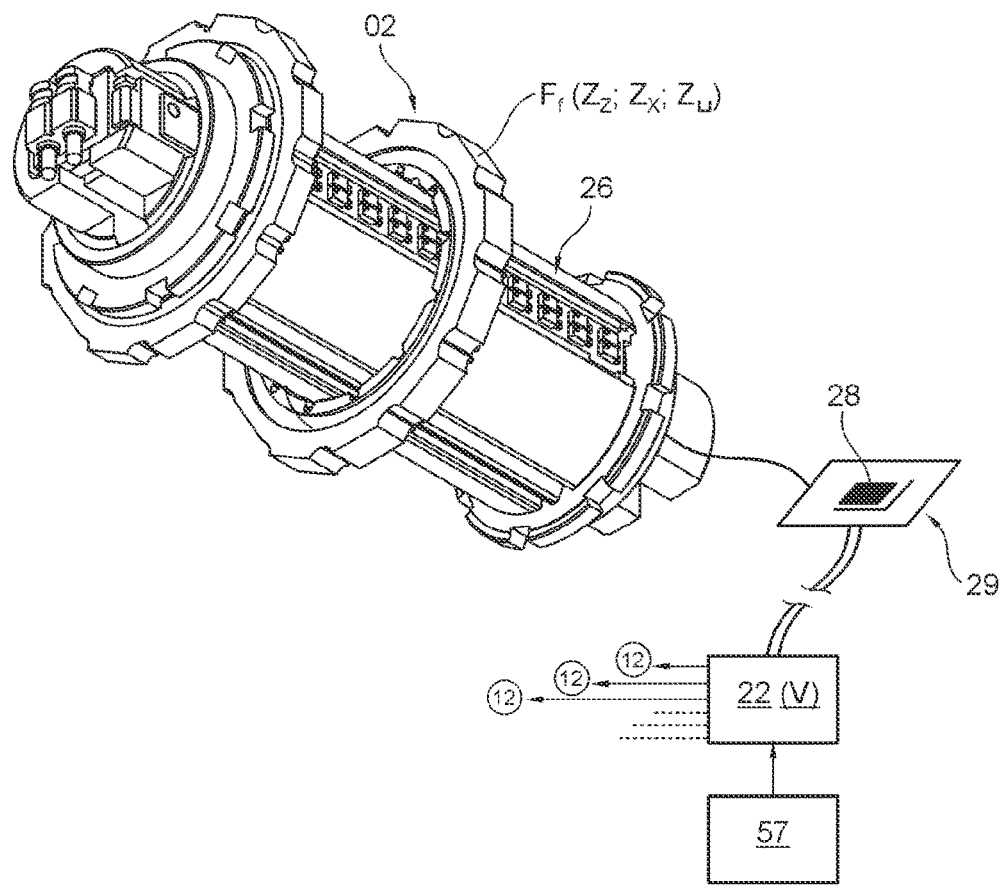
FIG. 7a a perspective illustration of a shaft with examples of labeling rings and an arrangement of sensors.
Figure 7B:
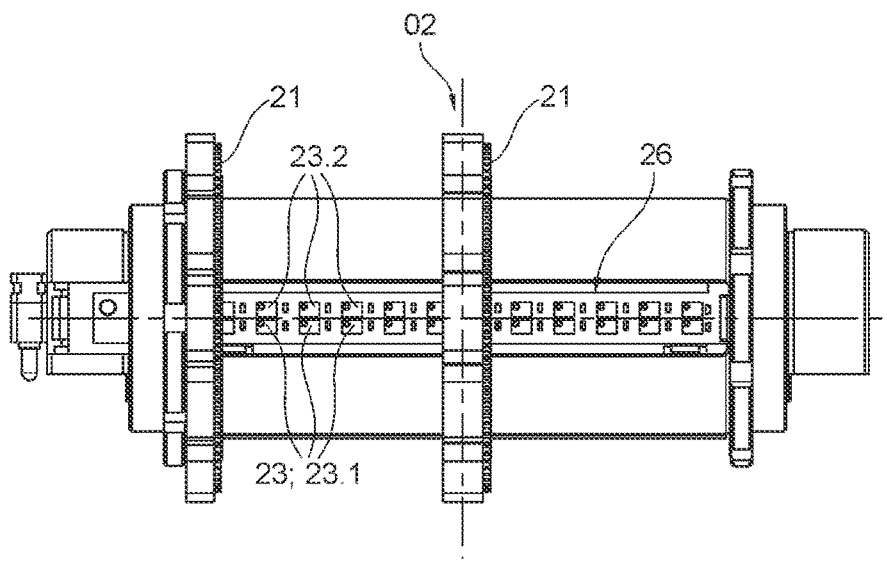
FIG. 7b a schematic side view of a shaft with examples of labeling rings and an arrangement of sensors.
Figure 8:
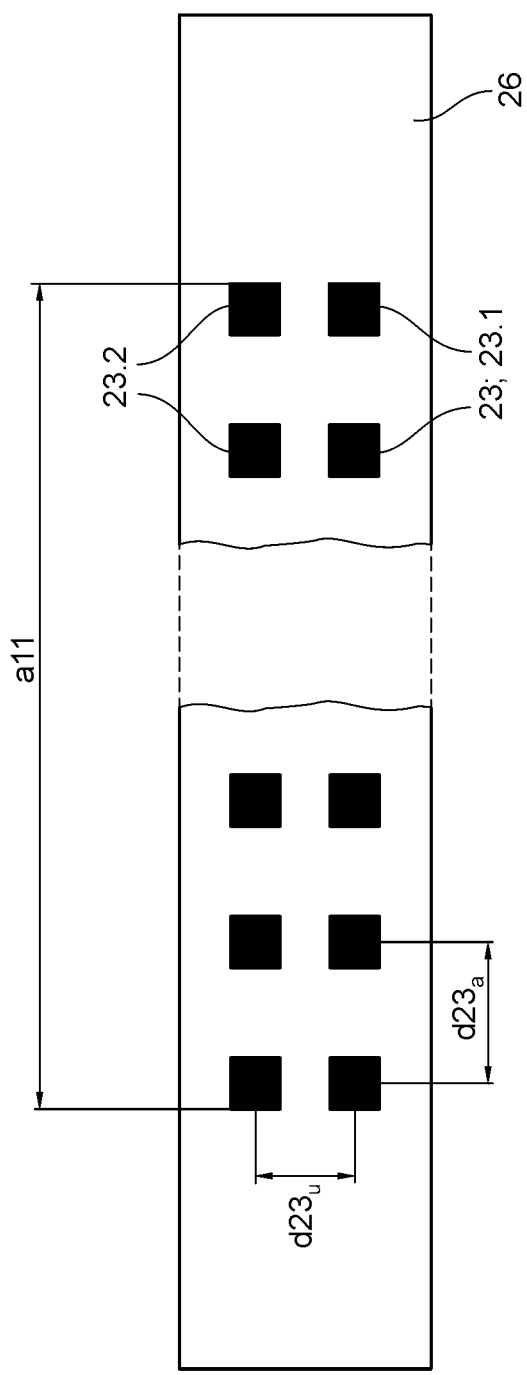
FIG. 8 a schematic illustration of an exemplary embodiment of the sensor device having a greater number of sensors arranged side by side than the number of labeling wheels.

In a particularly advantageous embodiment, the sensor device comprises two, in particular two or more, meaning at least two sensors 23.1; 23.2, e.g. magnetic field sensors 23.1; 23.2, in particular Hall effect sensors 23.1; 23.2, arranged one behind the other as viewed in the circumferential direction of the shaft 11, which cooperate with the marks $M_m$; $M_{m,r}$ of the same numbering wheel 02. From the signal curve S(23.1); S(23.2) of the circumferentially offset sensors 23.1; 23.2 (see, e.g. as qualitatively illustrated in FIG. 6 for two sensors 23.1; 23.2 offset in this way), the direction of rotation R of the relevant numbering wheel 02 can be analyzed. Both or the two offset sensors 23.1; 23.2 are spaced from one another by an angle which is smaller than the angle between the marks $M_m$ of two adjacent characters $Z_Z$; $Z_{\llcorner}$; $Z_X$ or fields $F_f$. For example, the two sensors 23.1; 23.2, as viewed in the circumferential direction, are arranged at a center-to-center distance $d23_u$, the length of which along the line continuing the outer circumferential surface of the shaft 11 is no more than 10 mm, for example, preferably no more than 5 mm, in particular no more than 2 mm.

In addition to or in place of this, a number n (n∈ℕ, n>2) of sensors 23; 23.1; 23.2 greater than the number m of rotatable numbering wheels 02 carrying alphanumeric characters $Z_Z$; $Z_\sqcup$; $Z_X$, in particular at least twice this number, arranged spaced, in particular equidistantly, from one another in the axial direction are provided side by side in the axial direction on the aforementioned longitudinal section all. For example, a multiplicity of sensors 23; 23.1; 23.2 (e.g. a number n of at least 25, preferably at least 50) are arranged side by side in such a way that their center-to-center distance $d23_a$ is less than 5 mm, for example, preferably less than 2 mm, in particular no more than 1 mm. This makes it possible to analyze multiple sensors 23; 23.1; 23.2 arranged side by side for each numbering wheel 02 and/or to equip the labeling device 01 with numbering wheels 02 of varying widths and/or numbers. In the latter case, with the width of the numbering wheels 02 to be used varying within certain limits, the shorter distance $d23_a$ as compared with the width of the numbering wheel ensures that at least one of the sensors 23; 23.1; 23.2 arranged side by side axially will always interact with the marks $M_m$; $M_{m,r}$ of a numbering wheel 02. During initialization of the system comprising the labeling device 01, the associated sensor device, and the analysis routine, a fixed sensor 23; 23.1; 23.2 can then be assigned to each numbering wheel 02, or multiple sensors 23; 23.1; 23.2 lying in alignment with the numbering wheel 02 in question can be assigned and analyzed in combination according to fixed rules.

The multiplicity of sensors 23; 23.1; 23.2 provided side by side and optionally in a row in pairs can preferably be arranged, for example in the form of an array comprising two rows and an aforementioned multiplicity of columns, on a carrier element 26 which can be fitted as a whole onto the shaft 11 or into a recess 27 provided there. Such a carrier element 26 can be embodied as a carrier board 26 fitted with the sensors 23; 23.1; 23.2 and having conductor tracks for signals transmission extending toward one side on its back surface, for example. From there the signals can be fed, e.g. via flexible signal lines, to an analysis routine, which is implemented in the aforementioned control device 22 or in an analysis means 28 provided specifically for this purpose, e.g. a suitably configured data processing chip 28, which is comprised, for example, by data processing means 29, e.g. a signal processing device 29, assigned to the sensor device, in particular its row or array of sensors 23; 23.1; 23.2.

Figure 9A:
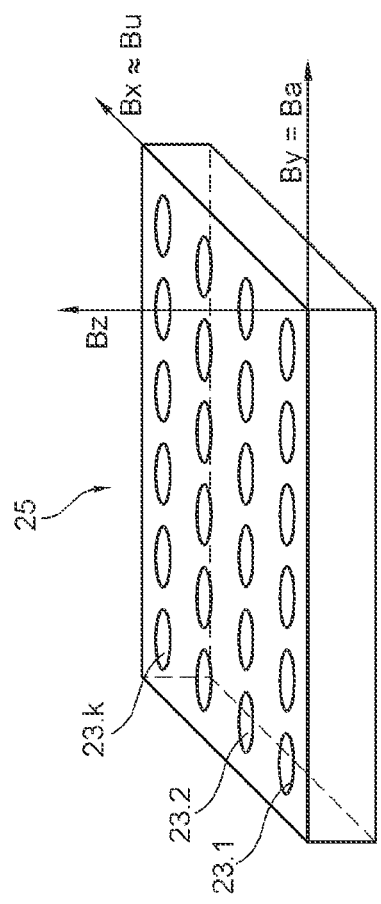
FIG. 9a a schematic illustration of an exemplary embodiment of the sensor device having a number of sensor arrays.
Figure 9B:
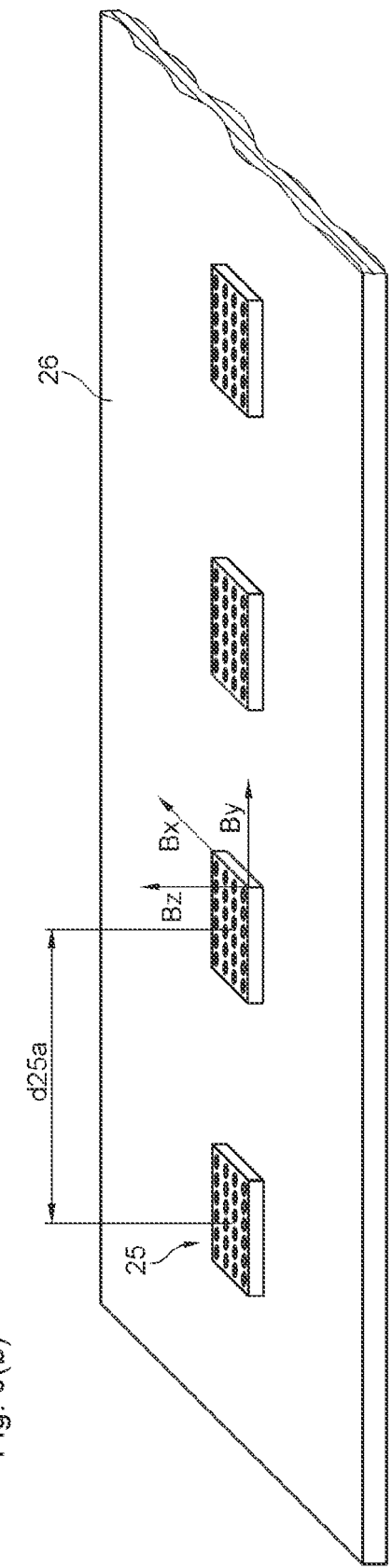
FIG. 9b a schematic illustration of an exemplary embodiment of a carrier board with a number of the sensor arrays.

In an advantageous embodiment, in place of the aforementioned pairs of sensors 23.1; 23.2, unidimensional or bidimensional groups 25 of sensors 23; 23.1; 23.2, 23.k (k=3, 4, 5 . . . ), in particular Hall effect sensors 23; 23.1; 23.2, 23.k are provided, e.g. in the form of sensor arrays 25, which are configured to supply two magnetic field vector components of an existing magnetic field, e.g. in the case of a unidimensional sensor array 25, or three such magnetic field vector components Bx, By, Bz in the case of a bidimensional sensor array 25 (see, e.g. FIG. 9). The sensor array 25 is preferably oriented and arranged such that two field vector components Bx, By, Bz lie in a plane which is preferably perpendicular to the axis of rotation of the numbering wheels 02, and one of the field vector components Bx preferably runs in the circumferential direction, or at the measurement location in the tangential direction, and one of the field vector components Bz runs in the radial direction of the numbering wheel 02. In the case of three magnetic field vector components Bx, By, Bz, for example, a calculable field vector component Bx, By, Bz additionally runs in the axial direction, for example. Analysis of the latter can help to eliminate edge effects or influence by neighboring numbering wheels 02, for example.

A sensor array 25 can comprise, for example, multiple, e.g. two or more sensors 23; 23.1; 23.2, 23.k one behind the other as viewed in the circumferential or tangential direction and can optionally also comprise multiple, e.g. two or more sensors 23; 23.1; 23.2, 23.k side by side in the axial direction. The sensors 23; 23.1; 23.2, 23.k of a sensor array 25 can be combined in a component, e.g. on a circuit board or an IC module. A sensor array 25 can comprise more than six, in particular more than ten sensors 23; 23.1; 23.2, 23.k.

A number of such groups 25 corresponding to or, as described above, greater than the number of numbering wheels 02 are provided side by side in the axial direction. These can be provided in an axially parallel row on an aforementioned carrier element 26, for example. In this embodiment, only one row is required to detect the marks $M_m$; $M_{m,r}$ and the direction of movement. In a modification, however, it is also possible for two or more such rows offset from one another in the circumferential direction to be provided. The center-to-center distance $d25_a$ between two adjacent groups 25 in the axial direction here can be less than 5 mm, for example, preferably less than 2 mm. The distance $d23_u$ between two circumferentially offset sensors 23.1; 23.2, 23.k of the same sensor array 25 is also no more than 10 mm here, for example, preferably no more than 5 mm, in particular no more than 2 mm.

Thus, the sensor arrangement is preferably configured with two or more sensors 23; 23.1; 23.2, 23.k for each numbering wheel 02 to be positioned by an individual motor, such that, by analyzing the signals from two or more sensors 23; 23.1; 23.2, 23.k assigned to one numbering wheel 02, both the passage of a mark and the direction of movement, i.e. the direction of rotation, of the numbering wheel 02 can be deduced. Sensors 23; 23.1; 23.2 arranged in a row in pairs or the aforementioned sensor arrays 25 having a plurality of sensors 23; 23.1; 23.2, 23.k, 23.k may be provided. The number of sensor pairs 23.1, 23.2 or sensor arrays 25 may correspond to the number of numbering wheels 02 to be positioned by individual motors or, in an advantageous refinement, may be greater, as described. Regardless of the arrangement and embodiment, the angular distance between the sensors 23.1; 23.2 of a pair of sensors 23.1, 23.2 which are offset from one another in the circumferential direction or of two circumferentially offset sensors 23.1; 23.2, 23.k of the same sensor array 25 is smaller than the angular distance between two consecutive characters on the circumference of the numbering wheel 02.

Generally independently of the above-described use for referencing a stepper motor 12 that serves to drive a numbering wheel 02 and independently of the aforementioned embodiments of the sensor system, but advantageously in conjunction with such a use and/or sensor device, an advantageous embodiment of a system for securing the selected working position of one, multiple, or all of the numbering wheels 02 provided in the labeling device 01 is described in the following.

For this purpose, the labeling device 01 preferably comprises a locking means 31 for securing the working position assumed for the selected character, which can be moved by an actuator 32; 32'; 32" from an active position, in which it secures the working position, to an inactive position. In the active position, the locking means 31 advantageously cooperates at least with all the numbering wheels 02 that have alphanumeric characters $Z_Z$ on their circumference, but preferably with all the rotatably mounted and rotationally driven numbering wheels 02, to secure them in position.

The locking means 31 can be configured in the manner of a pawl 31 and/or can engage into corresponding engagement means 44, e.g. into indentations 44 or protrusions 44, on the outer or inner circumference of the respective numbering wheel 02.

The locking means 31 can generally be controlled by means of actuators 32; 32'; 32" of any desired embodiment, as long as these can induce at least an activation or deactivation. Preferably, however, the actuator 32; 32'; 32" for controlling the locking means 31 is in the form of an electromechanically operated drive means 32; 32'; 32", which can be moved selectively, as a result of different actuation, with its output-side driven element 33; 33'; 33" into at least two different defined switching positions which bring about the active and the inactive position of the locking means 31. In other words, in contrast, e.g., to only one defined direction of force acting counter to a spring force, for example, and possibly counter to a stop, in this case at least two stable actuator states with different states for the output-side driven element 33; 33'; 33" can be brought about through appropriate actuation and the application of electromagnetic energy to the drive means 32; 32'; 32". A stable state is understood here, e.g. as one in which displacement from the occupied stable position is possible only when a threshold force or holding force or a threshold torque or holding torque, in particular significant, or such a force or torque being exerted mechanically from the outside is exceeded. A significant threshold or holding force in this case can be a force of at least 0.5 N, preferably at least 0.8 N, or a significant threshold or holding torque can be at least 1.0 mNm, preferably at least 1.2 mNm, for example.

Figure 14A:
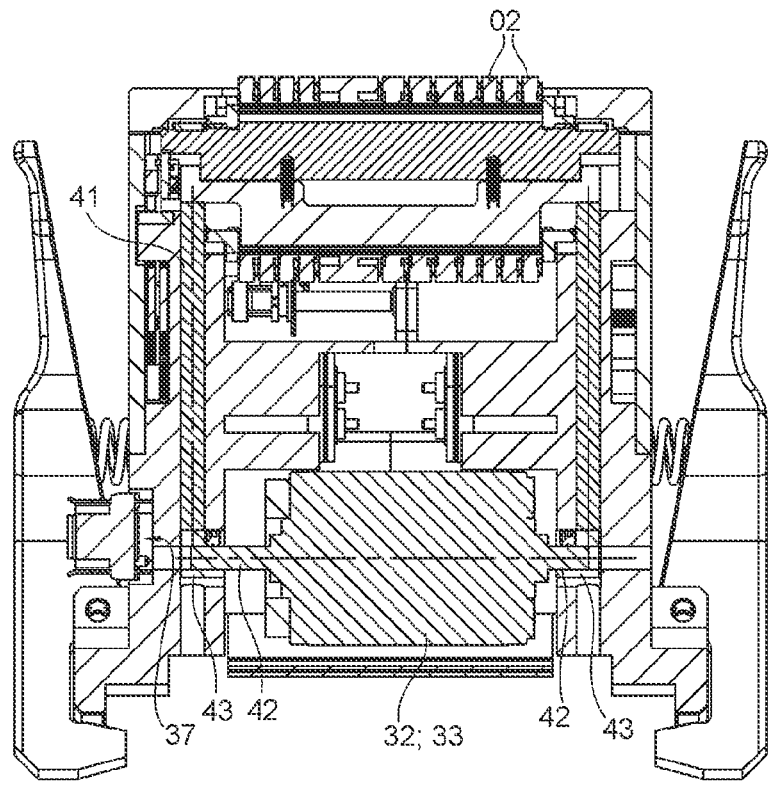
FIG. 14a an exemplary embodiment for the driving of a locking means in the first embodiment by a rotating actuator with multiple defined switching states in a sectional view along the shaft.
Figure 14B:
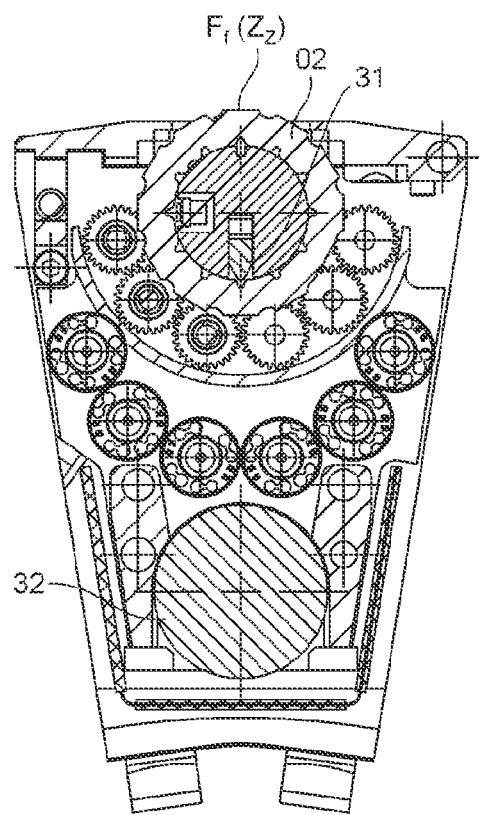
FIG. 14b the exemplary embodiment for the driving of a locking means in a sectional view perpendicular to the shaft.

In a first advantageous embodiment (see, e.g. FIG. 14), the provided actuator 32 is in the form of an electric motor 32 with a rotor 33 as a driven element 33, preferably a stepper motor 32, with rotor angular positions that can be specifically approached. In that case, in the drive train between the actuator 32 and the locking means 31 to be controlled, a gear mechanism 37, e.g. in the form of an eccentric mechanism 37, is provided, which converts the movement of the rotating driven means 33 into a preferably linear positioning movement of the locking means 31 that has at least one radial movement component. Shaft ends protruding from the electric motor 32 at both ends or shaft pieces 42 extending these shaft ends each support an eccentric disk 43, for example, and these disks engage in boreholes provided in connecting rods 41 which engage on the locking means 31.

In a second advantageous embodiment (see, e.g. FIG. 15 and FIG. 16), a linear motor 32'; 32" having an armature 33'; 33" as a driven element 33'; 33" is provided as the actuator 32'; 32". It is preferably embodied as a bidirectional actuator 32'; 32".

In a first variant of the linear motor 32' (see, e.g. FIG. 15), the motor is embodied as a bistable reluctance motor 32'. In that case, the armature 33' can be actively moved back and forth in the two directions by alternately energizing two coils 34; 36 arranged spaced from one another in the direction of rotation of the armature 33'.

In a second variant (see, e.g. FIG. 16), the linear motor 32" is embodied as a linear electric motor 32" which has an armature 33" comprising a coil winding or a permanent magnet as a driven element 33". Depending on how it is energized, the armature 33" can be moved linearly in one direction or the other.

Generally, an aforementioned actuator 32'; 32" with its driven element 33'; 33" in the form of an armature 33'; 33" can act on the locking means 31 directly or via a corresponding extension and, if applicable, a fork in order to activate and deactivate the locking means. It is also possible for two such linear actuators 32'; 32" to be provided connected in parallel, which can then engage at both ends of the locking means 31.

Preferably, however, in the drive train between the respective linear actuator 32'; 32" and the locking element 31 to be controlled, a gearset 37; 37'; 37" that converts the movement of the driven means into a movement of the locking means 31 is provided.

Figure 15:
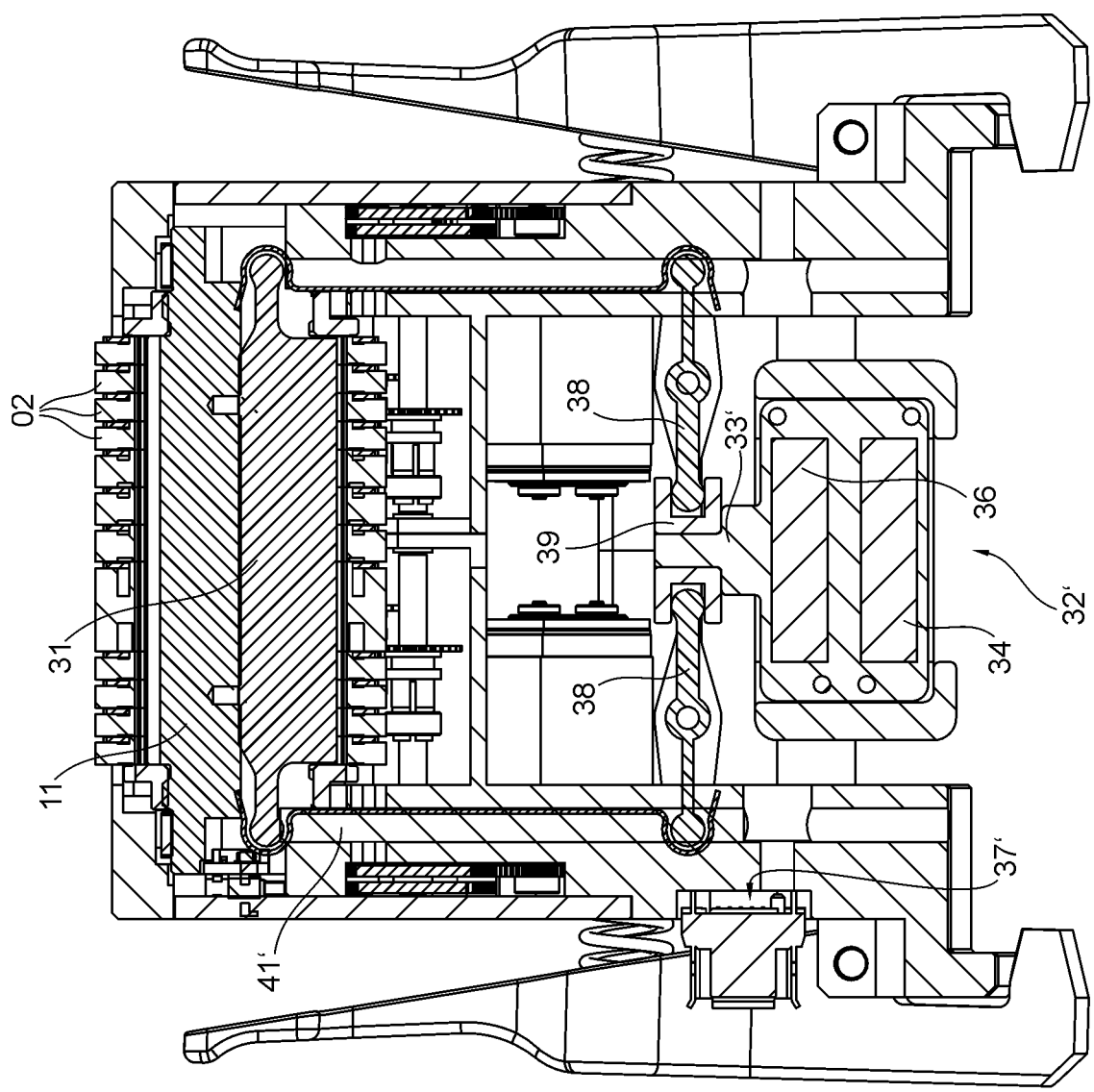
FIG. 15 a first variant of a second embodiment for the driving of the locking means by a linear actuator with multiple defined switching states.

In that case, particularly if the positioning direction of the output element 33' has at least one radial movement component, a lever mechanism 37' having a lever 38—in particular two-armed—can be provided in the drive train between the driven element 33'; 33" of the linear actuator 32'; 32" and the locking means 31 (see, e.g. FIG. 15). One end of the lever 38 is pivoted by the driven element 33'; 33", for example by means of a driver 39 or some other type of coupling which is moved by the driven element 33'; 33", while at a second point of engagement, e.g. at the other end, a connecting rod 41'; 41" which is articulated to the locking means 31 engages. Preferably, two connecting rods 41'; 41" engaging at the respective ends of the locking means 31 are moved by means of the driven element 33'; 33" via the driver 39 or some other type of coupling and two levers 38.

Figure 16:
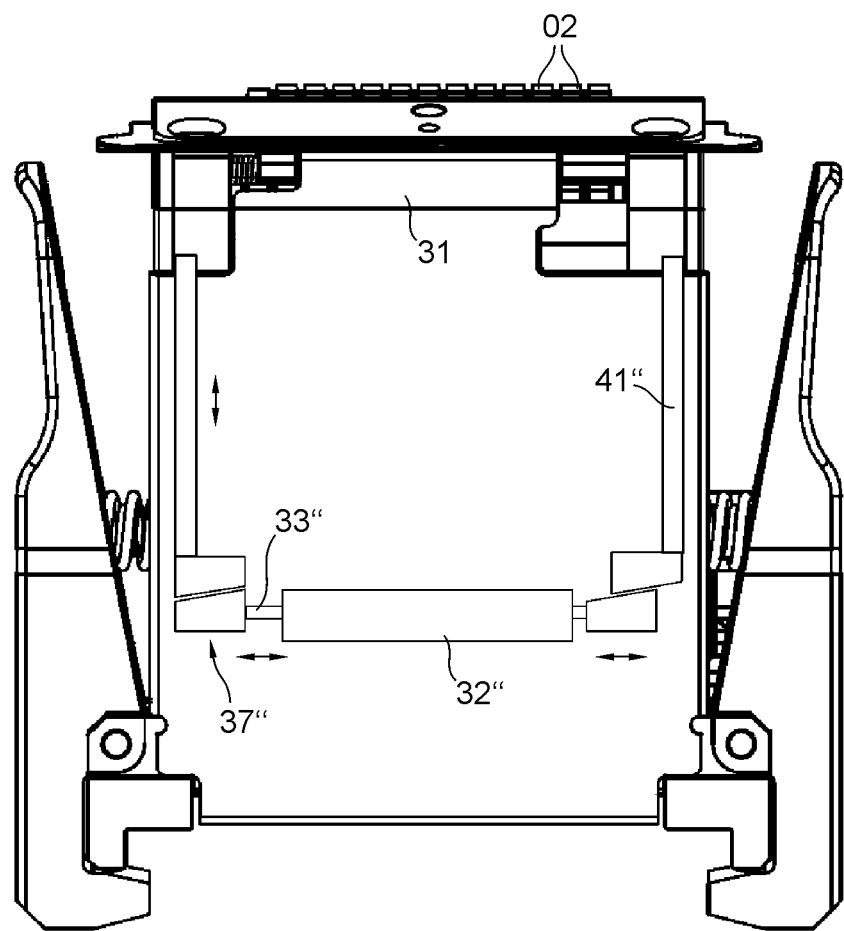
FIG. 16 a second variant for the second embodiment of the driving of the locking means by a linear actuator with multiple defined switching states.

In another embodiment of the gear mechanism 37"—particularly if the positioning direction of the driven element 33" runs perpendicular to the positioning direction of the locking means 31—in place of the driver 39 pivoting the two levers 38 a gear mechanism 37", in particular a wedge mechanism 37", can be provided, which converts a movement of the driven element 33'; 33" parallel to the shaft 11 into a positioning movement with at least one movement component running radially to the numbering wheel 02 (see e.g. FIG. 16). On the output side, the gear mechanism 37" acts on a connecting rod 41'; 41" which engages on the locking means 31.

In the exemplary embodiments according to FIG. 15 and FIG. 16, the two types of linear actuators 32'; 32" described above can also be used alternatingly.

In all the variants that have a linearly acting actuator 32'; 32", as an alternative to one actuator 32'; 32" that provides two stable states, it is also possible for two actuators acting unilaterally and counter to one another to be provided, which are then activated and deactivated alternatingly. An actively induced active position of the locking means 31 and an actively induced inactive position of the locking means are also provided in this way.

As was already mentioned above, the locking means 31 can be in the form of a pawl 31 and can engage in associated indentations 44 on the outer or inner circumference of the respective numbering wheel 02 or between teeth of a gearwheel 16; 17; 18; 19; 21 provided in the drive train of the numbering wheel 02 in question. For this purpose, in the region of the outer or inner circumference of the numbering wheel 02, e.g. at least a number of protrusions 44 or indentations 44 that corresponds to the number k of alphanumeric characters $Z_Z$ are provided, each protrusion or indentation being in a fixed circumferential position relative to one character $Z_Z$ carried on the outer circumference, wherein to produce the secured position, the locking means 31 can be brought into engagement with an indentation 44 or protrusion 44, in particular with an indentation 44 or protrusion 44 of a character $Z_Z$ other than the character $Z_Z$ that has been moved into the working position.

Generally independently of the above-described use for referencing a stepper motor 12 that drives a numbering wheel 02, the aforementioned embodiments of the sensor system, and the embodiment of the drive for the locking means 31, but advantageously in conjunction with such a use and/or sensor device and/or drive embodiment, in an embodiment that is preferred here, the locking means 31 is arranged within the clear cross-sectional opening of the numbering wheel 02 intended to receive the shaft 11, in particular in an axially extending recess in the shaft 11, and engages from the inside into indentations 44 or protrusions 44 in the otherwise circular or cylindrical inner circumferential surface in the respective numbering wheel 02. These indentations 44 or protrusions 44 are arranged on the inner circumferential surface relative to the locking means 31 such that, when at least one alphanumeric character $Z_Z$ of each of the alphanumeric characters to be approached is in the working position, the locking means 31 is positioned opposite an indentation 44 or protrusion 44 in such a way that as the locking means is activated, it can be brought into engagement with that indentation 44 or protrusion 44. This engagement is preferably free of play as viewed in the circumferential direction.

The actuator 32; 32'; 32" for positioning the locking means 31 can generally likewise be arranged within the clear cross-sectional opening of the numbering wheel 02 for receiving the shaft 11, in particular in an axially extending recess in the shaft 11. In that case, the aforementioned connecting rods 41; 41'; 41" can optionally be omitted. Preferably, however, the actuator 32; 32'; 32" is arranged radially outside of the circumferentially extending outer surface of the numbering wheels 02, in which case the connecting rods 41; 41'; 41" that engage on the locking means 31 encompass the group of numbering wheels 02 from the two end faces, for example.

In a particularly advantageous embodiment of the labeling device 01, if a sensor device as described above is provided, for example, which cooperates with a number of k indentations 44 or protrusions 44 as marks $M_m$; $M_{m,r}$ for the purpose of confirming the assumption of working positions of respectively assigned characters, at least the indentations 44 or protrusions 44 assigned to the alphanumeric characters $Z_Z$ as marks $M_m$ can simultaneously serve as engagement means 44 for the locking means 31. In that case, the above description regarding the implementation, the handling or method of functioning, and the use of the sensor device and/or of the drive motor 12 in the form of a stepper motor 12 applies.

In particular, but not only in the latter case in which the marks $M_m$ also serve at the same time as engagement means 44 for the locking means 31, or vice versa, to secure the working position of a character $Z_Z$ the locking means 31 can preferably be brought into engagement with one of the indentations 44 or protrusions 44 which is different from the indentation or protrusion that serves the sensor device as the mark $M_m$ corresponding to the relevant character $Z_Z$ that has been moved into the working position.

Generally independently of the above-described use for referencing a stepper motor 12 that drives a numbering wheel 02, the aforementioned embodiments of the sensor system, the configuration of the drive for the locking means 31 or a combination thereof, but advantageously in conjunction with such a use and/or sensor device and/or drive configuration, a low-wear system is provided for transferring the supply power for operating the drive motors 12, the actuators 32; 32'; 32", and the electronics carried along on the numbering cylinder 06 and for the transmission of control signals relating to the numbering specifications.

In a first advantageous embodiment, the printing couple cylinder 06 that carries the numbering devices 01 is provided with a slip ring system 46 which has a slip ring 47 fixed to the cylinder and a sliding contact 48 for the transmission of electric power, fixed to the press, wherein a press-side modulator is provided for modulating the AC voltage signal used for the power supply using data signals that relate to information regarding characters $Z_Z$ to be selected on the labeling devices 01, along with a demodulator fixed to the cylinder, by means of which the data signals can be separated again from the modulated signal of the power supply (see, e.g. as indicated by dashed lines in FIG. 1 by way of example). As a result, only one slip ring system 46 with only one slip ring 47 is required, via which power and data can be transmitted via a common feed line 49, without additional traces.

In a second embodiment, which is even more advantageous in terms of wear, the printing couple cylinder 06 that carries the numbering devices 01 is assigned a transmitter 51 for the contactless transmission of electric power for operating the drive motors 12 and/or for the contactless transmission of data signals relating to the characters $Z_Z$ or character strings to be selected on the numbering devices 01, which transmitter comprises a transmitter part 52 which is fixed to the frame and a transmitter part 53 which is fixed to the cylinder during operation. Electric power and data signals, for example, are fed in separate feed lines 54; 56 to the transmitter part 52 which is fixed to the frame. The contactless transmission can then be carried out internally via two different channels or alternatively, via the AC voltage signal with a modulated data signal via the same channel.

While preferred embodiments of devices and a method for alphanumeric labeling of printing products and a security printing press, all in accordance with the present invention, have been set forth fully and completely hereinabove, it will be understood by one of skill in the art, that various changes could be made thereto, without departing from the true spirit and scope of the present invention, which is accordingly to be limited only by the appended claims.

The invention claimed is:

1. A device (01) for alphanumeric labeling of securities, comprising
a shaft (11) mounted in a frame (03), around which shaft (11) a plurality of wheel-shaped or ring-shaped labeling tools (02), each carrying multiple, i.e. a number k (k∈ $\mathbb{N}$, k>1) of alphanumeric characters ($Z_Z$) one behind the other on its outer circumference, are rotatably mounted,
drive means, each drive means having one drive motor (12), for multiple or for each of the plurality of labeling tools (02), by which drive means these plurality of labeling tools (02) can be rotated mechanically independently of one another around the shaft (11),
and a sensor device having at least one sensor (23; 23.1; 23.2), which is fixed relative to the frame during operation, for each of the plurality of labeling tools (02), the at least one sensor cooperating with at least a number l (l∈ $\mathbb{N}$, l≥k) of marks ($M_m$; $M_{m,r}$), corresponding to the number k of alphanumeric characters ($Z_Z$), which marks are specific to a functioning method of the at least one sensor (23; 23.1; 23.2) and are provided on a respective labeling tool (02), of the plurality of labeling tools each in a fixed circumferential position relative to one character ($Z_Z$; $Z_\sqcup$; $Z_X$) carried on an outer circumference of the respective labeling tool, characterized in that the at least one sensor (23; 23.1; 23.2) is fixed relative to the shaft during operation and is arranged within a clear cross-section of openings in the plurality of labeling tools (02) for receiving the shaft (11), and the marks ($M_m$; $M_{m,r}$) are provided in a region of an inner circumference of the relevant one of the plurality labeling tools (02), which surrounds the opening, and/or in that the sensor device comprises two sensors (23.1; 23.2) arranged one behind the other as viewed in a circumferential direction of the shaft (11).

2. The device according to claim 1, characterized in that the two sensors (23.1; 23.2) are provided within an angular distance smaller than the angular distance between two consecutive characters ($Z_Z$; $Z_\_$; $Z_X$), as viewed around the axis of rotation of the numbering wheels, and/or are comprised by a sensor array (25) by which at least two magnetic field vector components (Bx, By, Bz) lying in one plane of an existing magnetic field can be detected.

3. The device according to claim 1, characterized in that, in addition to the marks ($M_m$) assigned to the alphanumeric characters ($Z_Z$; $Z_\_$; $Z_X$), a mark ($M_{m,r}$) which serves as a reference for the assumption of a defined angular position, or a reference mark ($M_{m,r}$), is provided.

4. The device according to claim 1, characterized in that each at least one sensor (23; 23.1; 23.2) is in the form of a magnetic field sensor (23; 23.1; 23.2) and/or the sensor device comprises a magnet (24).

5. The device according to claim 1, characterized in that the number of marks ($M_m$; $M_{m,r}$) is provided in the form of an inhomogeneity in magnetic susceptibility and/or permeability, and providing a deviation from a circular or cylindrical profile in the inner circumferential surface, facing the shaft (11), of a magnetic material of the labeling tool (02) which does not itself generate a magnetic field, and/or in that the mark ($M_m$; $M_{m,r}$) is provided in the form of an indentation ($M_m$; $M_{m,r}$) or protrusion ($M_m$; $M_{m,r}$) in the otherwise circular or cylindrical inner circumferential surface of the numbering wheel (02) mounted on the shaft.

6. The device according to claim 1, characterized in that on a longitudinal section (a11) of the shaft (11) a plurality, i.e. a number p (p∈N, p>1), of ring-shaped labeling tools (02) carrying alphanumeric characters ($Z_Z$) are rotatably mounted, and a number n (n∈N, n≥m), corresponding to precisely or at least this number m, of sensors (23; 23.1; 23.2) are provided spaced, from one another in the axial direction.

7. The device according to claim 1, characterized in that a locking means (31) is provided, which can be moved selectively into a secured position to secure the working position assumed for a selected character ($Z_Z$; $Z_\_$; $Z_X$) or a field ($F_f$) that carries the selected character ($Z_Z$; $Z_\_$; $Z_X$) and which cooperates with indentations (44) or protrusions (44) on the labeling tool (02) or on a rotating driven member of the drive means that drives the labeling tool (02).

8. The device according to claim 7, characterized in that the locking means (31) can be brought into engagement with one of the indentations (44) or protrusions (44) acting as a mark ($M_m$; $M_{m,r}$), or with an indentation (44) or protrusion (44) of a character ($Z_Z$; $Z_\_$; $Z_X$) or field ($F_f$) other than the character ($Z_Z$; $Z_\_$; $Z_X$) or field ($F_f$) that has been moved into the working position.

9. The device according to claim 7, characterized in that an electromagnetically operable actuator (32; 32'; 32") is provided, which electromagnetically operable actuator can be actively moved with an output-side driven element (33; 33'; 33"), through the corresponding application of electric energy, into at least two different stable switching states which bring about the secured position and an inactive position.

10. The device according to claim 9, characterized in that a linear motor (32'; 32") having an armature (33'; 33") acting as a driven element (33'; 33") is provided as the electromagnetically operable actuator (32'; 32").

11. The device according to claim 9, characterized in that an electric motor (32) having a rotor (33) acting as a driven element (33) is provided as the actuator (32).

12. The device according to claim 9, characterized in that, in the drive train between the electromagnetically operable actuator (32; 32'; 32") and the locking element (31) to be positioned, a gear mechanism (37; 37'; 37") that converts the movement of the driven element (33; 33'; 33") to a movement of the locking means (31) is provided.

* * * * *